US009299959B2

(12) United States Patent
Goto et al.

(10) Patent No.: US 9,299,959 B2
(45) Date of Patent: Mar. 29, 2016

(54) INKJET DEVICE AND MANUFACTURING METHOD FOR ORGANIC EL DEVICE

(71) Applicant: PANASONIC CORPORATION, Osaka (JP)

(72) Inventors: Masashi Goto, Hyogo (JP); Hirotaka Nanno, Kyoto (JP); Masakazu Takata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/389,000

(22) PCT Filed: Jun. 4, 2013

(86) PCT No.: PCT/JP2013/003497
§ 371 (c)(1),
(2) Date: Sep. 29, 2014

(87) PCT Pub. No.: WO2013/183280
PCT Pub. Date: Dec. 12, 2013

(65) Prior Publication Data
US 2015/0072458 A1 Mar. 12, 2015

(30) Foreign Application Priority Data

Jun. 6, 2012 (JP) ................................ 2012-129269

(51) Int. Cl.
*B41J 2/045* (2006.01)
*H01L 51/00* (2006.01)
(Continued)

(52) U.S. Cl.
CPC .............. *H01L 51/56* (2013.01); *B41J 2/0459* (2013.01); *B41J 2/04581* (2013.01);
(Continued)

(58) Field of Classification Search
CPC . H01L 51/56; H01L 51/0005; H01L 51/5012; H01L 27/3246; H05B 33/10; B41J 2/04581; B41J 2/04588; B41J 2/0459; B41J 2/04593; B41J 2/04596; B41J 2/04598; B41J 2/14233; B41J 2202/09
See application file for complete search history.

(56) References Cited

U.S. PATENT DOCUMENTS 5,443,922 A 8/1995 Nishizaki et al.
5,864,351 A * 1/1999 Silverbrook .................... 347/57
(Continued)

FOREIGN PATENT DOCUMENTS

JP 5-163488 6/1993
JP 09-300613 11/1997
(Continued)

OTHER PUBLICATIONS

Internation Search Report for PCT/JP2013/003497, Dated Aug. 20, 2013.*
(Continued)

*Primary Examiner* — Mary Wilczewski
(74) *Attorney, Agent, or Firm* — Greenblum & Bernstein P.L.C.

(57) ABSTRACT

An ink jet device includes: an ink jet head including a nozzle through which ink droplet is ejected by applying voltage to piezoelectric element; and an ejection control unit controlling ink droplet ejection amount by varying voltage, voltage waveform of the voltage includes: preliminary vibration wave form part for preliminary drive operation of pushing ink toward outer edge of the nozzle to the extent that the droplet is not ejected; and main vibration waveform part for main drive operation of ejecting the droplet through the nozzle after the preliminary drive operation, the ejection control unit performs the preliminary and main drive operations according to the preliminary vibration waveform part and the main vibration waveform part, respectively, and proportion of displacement amount X of the voltage for the preliminary drive operation to displacement amount Y of the voltage for the main drive operation is set to 20%≤X/Y≤40%.

9 Claims, 15 Drawing Sheets

(51) Int. Cl.
  *H01L 51/56* (2006.01)
  *H05B 33/10* (2006.01)
  *B41J 2/14* (2006.01)
  *H01L 27/32* (2006.01)
  *H01L 51/50* (2006.01)

(52) U.S. Cl.
  CPC ......... *B41J 2/04588* (2013.01); *B41J 2/04593* (2013.01); *B41J 2/04596* (2013.01); *B41J 2/04598* (2013.01); *B41J 2/14233* (2013.01); *H01L 51/0005* (2013.01); *H05B 33/10* (2013.01); *B41J 2202/09* (2013.01); *H01L 27/3246* (2013.01); *H01L 51/5012* (2013.01)

(56) References Cited

U.S. PATENT DOCUMENTS

| | | | |
|---|---|---|---|
| 5,880,759 A * | 3/1999 | Silverbrook | 347/55 |
| 5,984,448 A * | 11/1999 | Yanagawa | 347/10 |
| 6,095,630 A * | 8/2000 | Horii et al. | 347/10 |
| 6,102,512 A | 8/2000 | Torii et al. | |
| 6,106,091 A * | 8/2000 | Osawa et al. | 347/9 |
| 6,273,538 B1 * | 8/2001 | Mitsuhashi et al. | 347/11 |
| 6,276,772 B1 * | 8/2001 | Sakata et al. | 347/10 |
| 7,370,925 B2 * | 5/2008 | Satake | 347/10 |
| 7,938,499 B2 * | 5/2011 | Matsumoto et al. | 347/14 |
| 2004/0239721 A1 | 12/2004 | Usuda | |
| 2005/0196526 A1 * | 9/2005 | Ishida | 427/66 |
| 2007/0257949 A1 | 11/2007 | Usuda | |
| 2010/0302296 A1 | 12/2010 | Ito et al. | |
| 2013/0277663 A1 | 10/2013 | Nanno et al. | |
| 2013/0285032 A1 | 10/2013 | Nanno et al. | |
| 2013/0292662 A1 | 11/2013 | Hashimoto et al. | |
| 2013/0292667 A1 | 11/2013 | Nanno et al. | |
| 2015/0072458 A1 * | 3/2015 | Goto et al. | 438/46 |

FOREIGN PATENT DOCUMENTS

| | | |
|---|---|---|
| JP | 2001-296420 | 10/2001 |
| JP | 2004-275956 | 10/2004 |
| JP | 2010-142675 | 7/2010 |
| JP | 2010-142676 | 7/2010 |
| JP | 2011-008228 | 1/2011 |

OTHER PUBLICATIONS

Written Opinion of the International Searching Authority for PCT/JP2013/003497, Dated Aug. 20, 2013.*
Search report from PCT/JP2013/003497, mail date is Aug. 20, 2013.
U.S. Appl. No. 14/390,481 to Takata et al., filed Oct. 3, 2014.

* cited by examiner

| Flight speed | Angle inequiality satisfactory/unsatisfactory for standards | Mist Yes/No |
|---|---|---|
| 3.4 m/s | Unsatisfactory | No |
| 5.4 m/s | Satisfactory | No |
| 7.2 m/s | Satisfactory | No |
| 9.1 m/s | Satisfactory | No |
| 10.9 m/s | Satisfactory | No |
| 12.7 m/s | Satisfactory | Yes |

| Flight speed | Angle inequality satisfactory/unsatisfactory for standards | Mist Yes/No |
|---|---|---|
| 2.6 m/s | Unsatisfactory | No |
| 4.7 m/s | Satisfactory | No |
| 6.6 m/s | Satisfactory | No |
| 8.3 m/s | Satisfactory | No |
| 10.2 m/s | Satisfactory | No |
| 12.2 m/s | Satisfactory | Yes |

INKJET DEVICE AND MANUFACTURING METHOD FOR ORGANIC EL DEVICE

TECHNICAL FIELD

The present invention relates to an ink jet device and a manufacturing method of an organic EL device with use of the ink jet device.

BACKGROUND ART

There have been proposed several drive systems for ejecting ink droplets with use of an ink jet device. Such drive systems includes a piezoelectric system which attracts attention because of being capable of precisely controlling volume of an ink droplet ejected through a nozzle of the ink jet head. According to the piezoelectric system, pressure is applied to ink housed in an ink housing unit and an ink droplet is ejected through the nozzle, by application of a voltage signal (drive voltage) to a piezoelectric element provided in the ink housing unit to reversibly expand or shrink the ink housing unit.

In recent years, consideration has been made on application of ink jet devices employing the piezoelectric system to an industrial field of manufacturing of organic EL (Electro Luminescence) devices as well as to a field of printing appliances for home use.

CITATION LIST

Patent Literature

[Patent Literature 1] Japanese Patent Application Publication No. H9-300613

SUMMARY OF INVENTION

Technical Problem

In order to manufacture organic EL devices with use of an ink jet device for example, it is necessary to eject ink droplets through nozzles of an ink jet head accurately to pixel apertures provided in a substrate, and to uniformize an amount of ink ejected in each pixel aperture. In other words, there is a demand for high landing accuracy and uniformity in volume of an ink droplet between the nozzles.

Here, volume of an ink droplet to be ejected through a nozzle is preliminarily determined in accordance with thickness of a film that is to be formed by drying ink. Since the volume of the ink droplet is proportional to drive voltage to be applied to a piezoelectric element, varying the drive voltage is an effective means for obtaining a desired droplet volume. At present, however, this means is difficult to adopt. This is because there is a case where a comparatively high drive voltage needs to be set for obtaining droplet volume in a wide range. Furthermore, a method of increasing the drive voltage is difficult to adopt even as a means for suppressing inequality in volume of the ink droplet between nozzles. For this reason, there is a demand at present for a means for ensuring uniformity in volume of the ink droplet between the nozzles. In addition, as a premise of the means for ensuring uniformity in volume of the ink droplet, there is also a demand for a means for obtaining droplet volume in a wide range without varying drive voltage as much as possible.

In the case where the drive voltage is increased, flight speed of the ink droplet increases as well as the volume of the ink droplet. When the ejected ink droplet flies forwards, a micro droplet (mist) having a volume smaller than a predetermined volume tends to be generated backward in accordance with the increase of the flight speed. This might cause landing failure. Accordingly, there is a demand for the means for obtaining droplet volume in a wide range without varying the drive voltage as much as possible, also in order to exhibit high landing accuracy.

In manufacturing of devices including the above organic EL devices with use of ink jet technology, there is a demand for high landing accuracy and uniformity in volume of an ink droplet between nozzles. Also, there is a demand for the means for obtaining droplet volume in a wide range without varying the drive voltage as much as possible.

The present invention was made in view of the above problems, and aims to provide an ink jet device and a manufacturing method of an organic EL device that are capable of performing wide-range control on droplet volume without varying drive voltage as much as possible.

Solution to Problem

In order to solve the above problem, one aspect of the present invention provides an inkjet device comprising: an ink jet head including an ink housing unit that houses therein ink, a pressure application unit that applies pressure to the ink by applying voltage to a piezoelectric element according to a voltage waveform, and a nozzle through which a droplet of the ink is ejected; and an ejection control unit that controls an ejection amount of the droplet of the ink by varying application voltage to be applied to the piezoelectric element, wherein the voltage waveform of the application voltage includes a preliminary vibration waveform part and a main vibration waveform part, the preliminary vibration waveform part is for performing a preliminary drive operation of pushing the ink toward an outer edge of the nozzle to the extent that the droplet of the ink is not ejected through the nozzle, the main vibration waveform part is for performing a main drive operation of ejecting the droplet of the ink through the nozzle after performance of the preliminary drive operation, the ejection control unit performs the preliminary drive operation and the main drive operation according to the preliminary vibration waveform part and the main vibration waveform part, respectively, and a proportion of a displacement amount X of the application voltage applied for performing the preliminary drive operation to a displacement amount Y of the application voltage applied for performing the main drive operation is set ensure that $20\% \leq X/Y \leq 40\%$ is satisfied.

Advantageous Effects of Invention

According to the ink jet device relating to the aspect of the preset invention, the preliminary drive operation is performed for pushing the ink toward the outer edge of the nozzle to the extent that the droplet of the ink is not ejected through the nozzle. After the preliminary drive operation is performed, the main drive operation is performed for ejecting the droplet of the ink through the nozzle. The drive waveform of the application voltage includes the preliminary vibration waveform part for performing the preliminary drive operation and the main vibration waveform part for performing the main drive operation.

Here, appropriate performance of the preliminary drive operation allows to preferably control the volume of the ink droplet to be ejected in the main drive operation. In other words, by adjusting the proportion X/Y of the displacement amount X of the application voltage applied for performing the preliminary drive operation to the displacement amount Y of the application voltage applied for performing the main drive operation so as to fall within the range of 20%≤X/Y≤40%, it is possible to perform wide-range on the volume of the ink droplet to be ejected through the nozzle, without too much varying the displacement amount Y of the application voltage which is for ejecting the ink droplet, or while suppressing variation of the displacement amount Y.

Furthermore, it is possible to prevent the proportion in displacement amount X/Y from falling below 20% where effects of increase in volume of the ink droplet cannot be clearly exhibited, and from exceeding 40% where the ink droplet might be ejected through the nozzle in the preliminary drive operation.

As a result, the ink jet device relating to the aspect of the present invention can perform wide-range control on droplet volume without varying drive voltage as much as possible.

BRIEF DESCRIPTION OF DRAWINGS

FIG. 6A shows drive waveform including a main vibration waveform part corresponding to a push-ejection method, FIG. 6B shows drive waveform not including a vibration suppression waveform part, and FIG. 6C shows drive waveform including a preliminary vibration waveform part corresponding to the push-ejection method.

DESCRIPTION OF EMBODIMENTS

Figure 1:
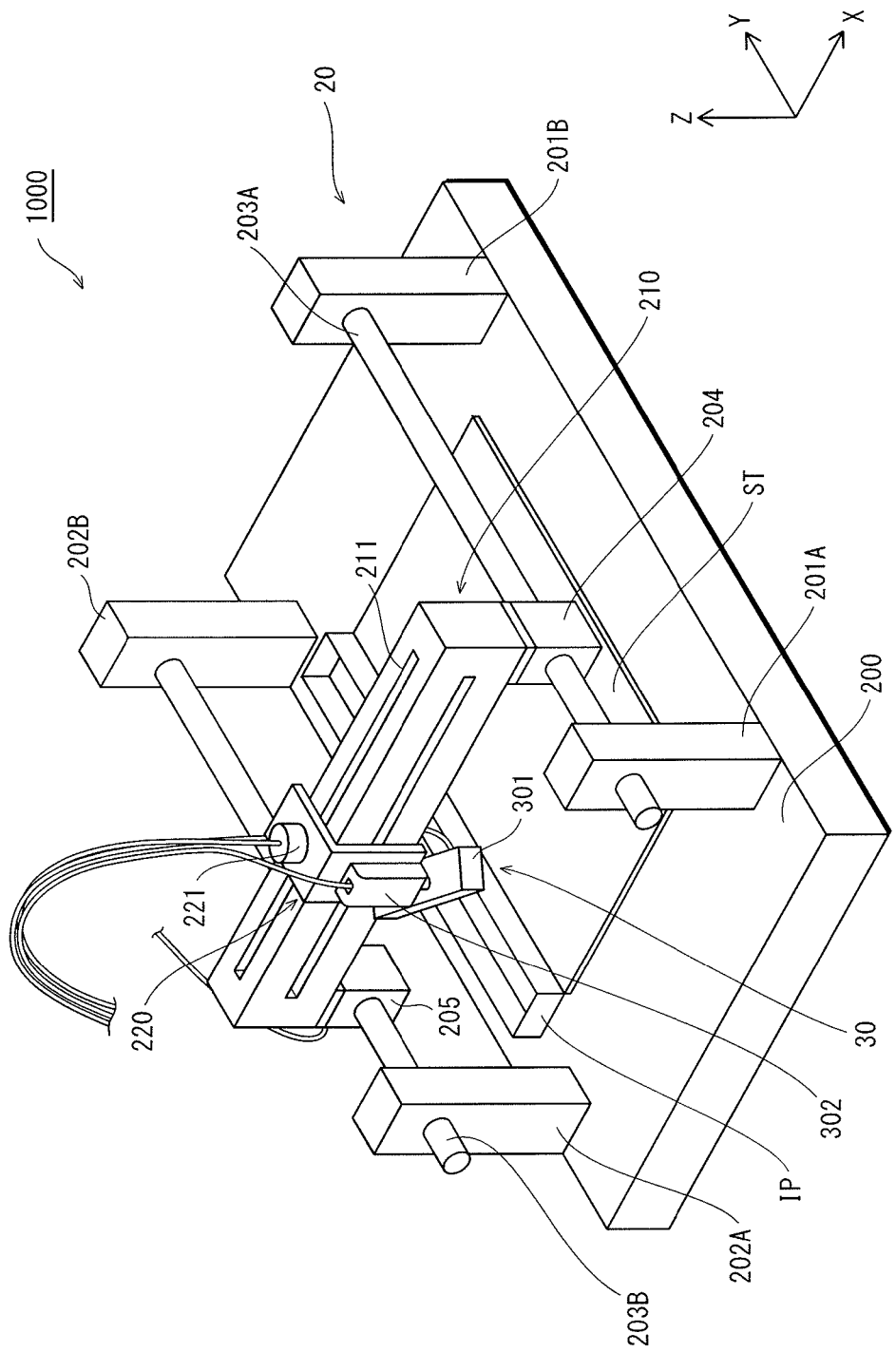
FIG. 1 shows the primary configuration of an ink jet device 1000 relating to an embodiment of the present invention.

Process by which the Present Invention is Achieved

In order to manufacture devices with use of an ink jet device that eject ink droplets through a plurality of nozzles, there is a demand for high landing accuracy and uniformity in volume of an ink droplet between the nozzles. Furthermore, there is a demand for a wide range of volume of an ink droplet.

Here, if the volume of the ink droplet to be ejected is set by varying drive voltage of the ink jet device, both of flight speed of the ink droplet, which might influence landing accuracy, and the volume of the ink droplet might sensitively vary with positive correlation coefficients. For this reason, it is desirable to set the volume of the ink droplet in a wide range without varying the drive voltage of the ink jet device as much as possible.

Here, the inventor and so on earnestly considered reasons why the drive voltage of the ink jet device needs to be set considerably high in order to increase the volume of the ink droplet to a certain value or higher. As a result, the inventor and so on found that when the drive voltage is applied for ink drop ejection, ununiform pressure is applied to the ink surface in the nozzle, and accordingly high electrical power is necessary to apply considerable pressure in order to eject a necessary ink droplet. Furthermore, the inventor and so on found that by pushing the ink to the extent that an ink droplet is not ejected before ejection of the ink droplet through the nozzle, it is possible to increase the volume of the ink droplet without increasing the drive voltage so much. The present invention was made based on the above expertise.

<Outline of One Aspect of the Present Invention>

One aspect of the present invention provides an inkjet device comprising: an ink jet head including an ink housing unit that houses therein ink, a pressure application unit that applies pressure to the ink by applying voltage to a piezoelectric element according to a voltage waveform, and a nozzle through which a droplet of the ink is ejected; and an ejection control unit that controls an ejection amount of the droplet of the ink by varying application voltage to be applied to the piezoelectric element, wherein the voltage waveform of the application voltage includes a preliminary vibration waveform part and a main vibration waveform part, the preliminary vibration waveform part is for performing a preliminary drive operation of pushing the ink toward an outer edge of the nozzle to the extent that the droplet of the ink is not ejected through the nozzle, the main vibration waveform part is for performing a main drive operation of ejecting the droplet of the ink through the nozzle after performance of the preliminary drive operation, the ejection control unit performs the preliminary drive operation and the main drive operation according to the preliminary vibration waveform part and the main vibration waveform part, respectively, and a proportion of a displacement amount X of the application voltage applied for performing the preliminary drive operation to a displacement amount Y of the application voltage applied for performing the main drive operation is set to ensure that 20%≤X/Y≤40% is satisfied. The proportion in displacement amount X/Y is set as above because the proportion in displacement amount X/Y of lower than 20% might not clearly exhibit effects of increase in volume of the droplet of the ink to be ejected and the proportion in displacement amount X/Y of higher than 40% might result in ejection of the droplet of the ink through the nozzle.

According to the aspect of the present invention, variation of drive voltage for ejecting an ink droplet is suppressed, and the displacement amount X of the application voltage for performing the preliminary drive operation is varied. This makes it possible to control volume of the ink droplet thereby performing wide-range control on the volume of the ink droplet without varying the drive voltage as much as possible.

The following describes in detail the preliminary drive operation relating to the aspect of the present invention. According to an inkjet method employing the piezoelectric system with a piezoelectric element for example, drive voltage is applied to the piezoelectric element in order to expand or shrink the housing unit to apply pressure to ink and generate a propagation wave in ink housed in the ink housing unit. As a result, an ink droplet is ejected through a nozzle. The ink surface has a meniscus shape such that pressure in the ink and surface tension of the ink surface are held in equilibrium. This is considered to cause ununiform energy of the propagation wave on the ink surface. As a result, the volume of the ink droplet to be ejected is not constant. That is, the meniscus shape of the ink surface is a disincentive to obtain an ink droplet having a defined volume. In view of this, by pushing the ink toward the outer edge of the nozzle before the ink droplet is ejected, it is possible to flatten the meniscus shape to apply uniform positive pressure to the ink surface for ejecting the ink droplet, thereby increasing the volume of the ink droplet.

According to a further preferable aspect of the present invention in consideration of the meniscus shape of the ink surface, the preliminary drive operation is performed for pushing the ink housed in the ink housing unit toward the outer edges of the nozzle such that the vertex position of the meniscus shape of the ink surface moves toward the edge of the nozzle. Through performance of the preliminary drive operation in this way, the ink housed in the ink housing unit is pushed toward the outer edge of the nozzle such that the meniscus shape of the ink surface is flattened. This makes it possible to apply further uniform positive pressure to the ink surface in order for ejecting the ink droplet in the main drive operation.

Furthermore, in the proportion in displacement amount X/Y, the displacement amount X of the application voltage, which is for pushing the ink in the preliminary drive operation, should be preferably set as large as possible. This is because the larger the displacement amount X is, the more the meniscus shape of the ink surface is flattened. In the case where the meniscus shape is not sufficiently flattened, vibration remaining on the ink surface due to the preliminary drive operation has considerably high amplitude, and might resonate with vibration occurring due to the main drive operation. Such a resonation is considered to cause ejection of another ink droplet having volume smaller than the defined volume. As a result, it is impossible to sufficiently exhibit effects obtained by performing the preliminary drive operation that uniform positive pressure is applied to the ink surface. The resonation occurs depends on correlation between magnitude of the amplitude of the vibration occurring due to the main drive operation and magnitude of the amplitude of the vibration remaining on the ink surface due to the preliminary drive operation. For this reason, the proportion in displacement amount X/Y of the application voltage is set to equal to or higher than 20%. The upper limit of the proportion in displacement amount X/Y is set to 40% because the proportion in displacement amount X/Y set to higher than 40% might cause ejection of ink droplet. Also in the further preferable aspect of the present invention in consideration of the meniscus shape of the ink surface, the displacement amount X of the application voltage in the preliminary drive operation is set to ensure that 20%≤X/Y≤40% is satisfied.

Also, according to another further preferable aspect of the ink jet device relating to the aspect of the present invention, the ink housing unit, the pressure application unit, and the nozzle may be each included in plural in the ink jet head, with respect to one or more of the nozzles, the ejection control unit may perform the preliminary drive operation and the main drive operation, and with respect to a remainder of the nozzles, the ejection control unit may not perform the preliminary drive operation.

According to the other further preferable aspect, the preliminary drive operation is selectively performed with respect to one or more of the nozzles included in the ink jet head. The following gives specific description. At present, it is impossible to uniformize volume of an ink droplet between nozzles due to process irregularities between the nozzles, inequality in physical properties of ink such as viscosity and surface tension between the nozzles, and so on. In view of this, the preliminary drive operation is performed in order to reduce the inequality in the volume of the ink droplet between the nozzles.

The pressure application unit relating to the aspect of the present invention is for example composed of a piezoelectric element having a laminated structure in which a piezoelectric material sandwiched between two electrodes. The pressure application unit is provided for each nozzle included in the ink jet head. One of the electrodes of the piezoelectric element is attached to a vibration plate, and the pressure application unit shrinks and expands the ink housing unit. The members constituting the ink housing unit or the members constituting the pressure application unit are manufactured and processed with accuracy, such that these members each have a predetermined size as designed such as area and thickness of the electrodes, the piezoelectric material, and the vibration plate or diameter of the nozzle.

However, there sometimes occur inevitable manufacturing irregularities and process irregularities of these members in terms of accuracy necessary for control on ink ejection behavior. The manufacturing irregularities and process irregularities cause inequality in positive pressure to be applied to an ink surface for ejecting an ink droplet, and as a result inequality exists in volume of an ink droplet to be ejected. Although the inequality in volume of the ink droplet is caused by the inevitable manufacturing irregularities and process irregularities, there is a demand for a means for suppressing the inequality as much as possible. One example of the means for the inequality is a means for controlling the volume of the ink droplet by varying drive voltage to be applied for ejecting the ink droplet. However, there is a case where if the drive voltage is varied, landing accuracy cannot be controlled. This is because flight speed of an ink droplet to be ejected is varied due to variation of the drive voltage, and the flight speed of the ink droplet to be ejected through the nozzles cannot be uniformly controlled.

In view of this, according to the other further preferable aspect of the present invention, the preliminary drive operation is selectively performed with respect to one or more nozzles included in the ink jet head through which an ink droplet having the defined volume is not ejected due to manufacturing irregularities of the members constituting the ink housing unit or the members constituting the pressure application unit. This makes it possible to perform wide-range control on the volume of the ink droplet to be ejected in the main drive operation. As a result, it is possible to control the volume of the ink droplet to be ejected uniformly between the nozzles without varying the drive voltage as much as possible.

Also, according to a yet another further preferable aspect of the ink jet device relating to the aspect of the present invention, the preliminary drive operation may be set to ensure that a flight speed V of a droplet of the ink to be ejected in the main drive operation satisfies 4 m/s≤V≤10 m/s.

In the case where the flight speed of the ink droplet is set low, the ejected ink droplet is deflected from a straight flight course thereof due to air resistance, and this deteriorates landing accuracy. In the case where the flight speed is set high on the other hand, when the ejected ink droplet (main droplet) flies forwards, a micro droplet of the ink is generated backward, and the micro droplet lands in a position shifted from a predetermined landing position of the main droplet. This also deteriorates landing accuracy. In order to exhibit excellent landing accuracy, it is important to optimize the flight speed of the ink droplet. The flight speed increases in accordance with increase of the drive voltage. Accordingly, in the case where the drive voltage is varied as a means for increasing the volume of the ink droplet to be ejected, not only the flight speed but also the volume of the ink droplet to be ejected increases. This causes a problem that an ink droplet having the defined volume cannot be ejected. According to the aspect of the present invention, it is possible to secure the volume of the ink droplet to be ejected in a wide range without varying the drive voltage as much as possible, by performing the preliminary drive operation. Also, even in the case where the displacement amount Y of the application voltage is fixed, it is possible to control the magnitude of the positive pressure to be applied to the ink surface in the main drive operation, by using a variable for the proportion in displacement amount X/Y, which is the proportion of the displacement amount X of the application voltage corresponding to the preliminary vibration waveform part for performing the preliminary drive operation to the displacement amount Y of the application voltage corresponding to the main vibration waveform part for performing the main drive operation.

In view of this, according to the yet another further preferable aspect, the preliminary drive operation is set to ensure that the flight speed V of the ink droplet to be ejected in the main drive operation satisfies 4 m/s≤V≤10 m/s. In the case where the flight speed V of the ink droplet falls below 4 m/s, deflection of a flight course of the ejected ink droplet is not tolerable, and this deteriorates landing accuracy. In the case where the flight speed V of the ink droplet exceeds 10 m/s on the other hand, a considerable number of micro droplets of the ink are generated in the backward of the ejected ink droplet, and this also deteriorates the landing accuracy. As a result, it is possible to secure the volume of the ink droplet to be ejected in a wide range and optimize the flight speed, by performing the preliminary drive operation to ensure that the flight speed V of the ink droplet satisfies 4 m/s≤V≤10 m/s.

Also, according to a still another further preferable aspect of the ink jet device relating to the aspect of the present invention, the voltage waveform of the application voltage may further include a vibration suppression waveform part for performing a vibration suppression operation of suppressing vibration occurring on a surface of the ink due to the main drive operation, and with respect to the nozzle with respect to which the preliminary drive operation is performed, the ejection control unit may perform the vibration suppression operation according to the vibration suppression waveform part.

After the ink droplets are ejected in the main drive operation, vibration remains on the ink surface due to the main drive operation. Accordingly, there is a case where the vibration remaining due to the main drive operation causes an unexpected ink droplet to separate from the ink surface and adhere near the nozzle. The ink droplet adhered near the nozzle is brought into contact with a subsequent ink droplet, and might defect flight direction of the subsequent ink droplet due to surface tension of the adhered ink droplet.

In view of this, according to the still another further preferable aspect of the present invention, with respect to the nozzle with respect to which the preliminary drive operation is performed, the vibration suppression operation for suppressing vibration occurring on the ink surface is performed after the main drive operation is performed. The voltage waveform of the application voltage includes the vibration suppression waveform part subsequent to the main vibration waveform part. By including the vibration suppression waveform part in the voltage waveform, it is possible to suppress vibration remaining on the ink surface due to the main drive operation, thereby preventing ink droplets from adhering to the nozzle. This exhibits high landing accuracy of an ink droplet to be ejected.

The following gives specific description. After the ink droplets are ejected in the main drive operation, vibration remains on the ink surface due to the main drive operation. The amplitude of the remaining vibration is the highest around the vertex position of the meniscus shape of the ink surface. Accordingly, there is a case where the vibration remaining due to the main drive operation causes an unexpected ink droplet to separate from the ink surface and adhere near the nozzle. In view of this, even in the further preferable aspect in consideration of the meniscus shape, it is optimal that drive voltage corresponding to the drive waveform including the vibration suppression waveform part subsequent to the main vibration waveform part should be applied with respect to the nozzle with respect to which the preliminary drive operation is performed.

Also, according to another further preferable aspect of the ink jet device relating to the aspect of the present invention, the surface of the ink at a start time of the main drive operation after performance of the preliminary drive operation may be positioned more downward than the surface of the ink at a start time of the main drive operation without performance of the preliminary drive operation.

There is a case where vibration, which remains on the ink surface due to the preliminary drive operation for pushing the ink, has considerably high amplitude toward the inside of the ink housing unit. In the case where the main drive operation is started at a position where the amplitude toward the inside of the ink housing unit has the maximum magnitude for example, effects can be suppressed that are obtained by pushing the ink toward the outer edge of the nozzle in the preliminary drive operation. Also, the remaining vibration resonates with vibration occurring due to the main drive operation, an ink droplet having volume smaller than the defined volume might be ejected.

In view of this, according to the other preferable aspect of the present invention, when the preliminary drive operation is performed with respect to the ink jet head, the surface of the ink at a start time of the main drive operation after performance of the preliminary drive operation may be positioned more downward than the surface of the ink at a start time of the main drive operation without performance of the preliminary drive operation. As a result, even when the vibration remaining on the ink surface due to the preliminary drive operation has high amplitude, it is possible to excellently exhibit the effects obtained by performing the preliminary drive operation.

The following gives specific description. Vibration remains on the ink surface due to pushing of ink in the preliminary drive operation. Amplitude of the remaining vibration is suppressed by flattening the meniscus shape in the preliminary drive operation. However, in the case where the main drive operation is started while the vertex of the ink surface that vibrates in accordance with the remaining vibration is positioned more inward in the ink housing unit than the vertex of the ink surface with no preliminary drive operation, the remaining vibration might resonate with vibration occurring due to the main drive operation. Particularly in the case where the main drive operation is started while the amplitude toward the inside of the ink housing unit has the maximum magnitude, the remaining vibration resonates with the vibration occurring due to the main drive operation to a great extent. Since this resonation might cause ejection of an ink droplet having volume smaller than the defined droplet, the effects obtained by performing the preliminary drive operation cannot be sufficiently exhibited.

In view of this, even in the further preferable aspect of the present invention in consideration of the meniscus shape of the ink surface, the main drive operation is started while the ink surface is positioned further more downward (closer to an outer edge of the nozzle) than the ink surface with no preliminary drive operation. As a result, it is possible to excellently exhibit the effects obtained by performing the preliminary drive operation.

In the further preferable aspect in consideration of the meniscus shape of the ink surface, the preliminary drive operation should be desirably started while the vertex of the meniscus shape of the ink surface is positioned closer to the outer edge of the nozzle than the vertex of the meniscus shape of the ink surface in static state.

After ink droplets are ejected in the main drive operation, the ink surface is restored to the meniscus shape. However, it is considered that the ink surface is not in static state, and vibration remains on the ink surface due to the main drive operation. In the case where the remaining vibration resonates with the vibration occurring due to the preliminary drive operation, the amplitude is the highest around the vertex of the meniscus shape. Particularly in the case where the preliminary drive operation is performed while the amplitude of the remaining vibration toward the inside of the ink housing unit is the maximum magnitude, the remaining vibration resonates with the vibration occurring due to the preliminary drive operation to a great extent. Since this resonation might cause ejection of an ink droplet during the preliminary drive operation, the effects obtained by performing the preliminary drive operation cannot be sufficiently exhibited.

In view of this, the preliminary drive operation is started while the vertex of the meniscus shape of the ink surface is positioned closer to the outer edge of the nozzle than the vertex of the meniscus shape of the ink surface in static state. As a result, it is possible to suppress resonation of the vibration remaining on the ink surface due to the main drive operation with the vibration occurring due to the preliminary drive operation, thereby further excellently exhibiting the effects obtained by performing the preliminary drive operation.

Another aspect of the present invention provides a method of manufacturing an organic EL device comprising: forming a first electrode on a substrate; forming one or more functional layers including a light-emitting layer on the first electrode; forming a second electrode on the functional layers, wherein in the forming the functional layers, the functional layers including at least the light-emitting layer are formed by applying ink including material of the functional layer and solvent with use of the ink jet device of any of the above aspects of the present invention, and evaporating and drying the solvent.

An organic EL display panel has the device configuration in which a plurality of organic EL elements are arranged on a substrate in matrix. An organic EL device has the device configuration in which anodes, one or more functional layers including a light-emitting layer, and a cathode are layered on a substrate in this order. In the forming the functional layers, the light-emitting layer is formed by the inkjet method as follows for example. Ink containing organic material of light-emitting layer is applied by the inkjet method to a plurality of pixel apertures that are partitioned by a barrier rib formed on the substrate. Then, solvent contained in the ink is removed by drying and so on.

According to an ink jet technique for layer formation with use of a conventional ink jet device, in the case where for example flight speed of an ink droplet relating to landing accuracy is kept without variation of drive voltage to be applied as much as possible, it is impossible to uniformly control volume of an ink droplet to be ejected, and this results in inequality in droplet volume. The inequality in volume of an ink droplet makes film thickness to be ununiform between pixels, and as a result electric current does not uniformly flow to the pixels, or electric current collectively flows to a part of a pixel having thin film thickness. This causes inequality or deterioration in light-emitting characteristics and light-emitting lifetime. The problem caused by the inequality in volume of an ink droplet to be ejected incurs decrease in manufacturing yield, and therefore urgent solution of this technical problem is desired.

In view of this, according to the manufacturing method relating to the other aspect of the present invention, the functional layers including at least the light-emitting layer are formed by applying ink including material of the functional layer and solvent with use of the ink jet device relating to any of the above aspects of the present invention, and evaporating and drying the solvent. As a result, it is possible to perform wide control on droplet volume without varying the drive voltage as much as possible, thereby performing control to eject ink droplets having uniform volume through the nozzles.

Embodiment 1

The following describes an ink jet device 1000 relating to the present embodiment with reference to the drawings.
<Ink Jet Device 1000>

Figure 2:
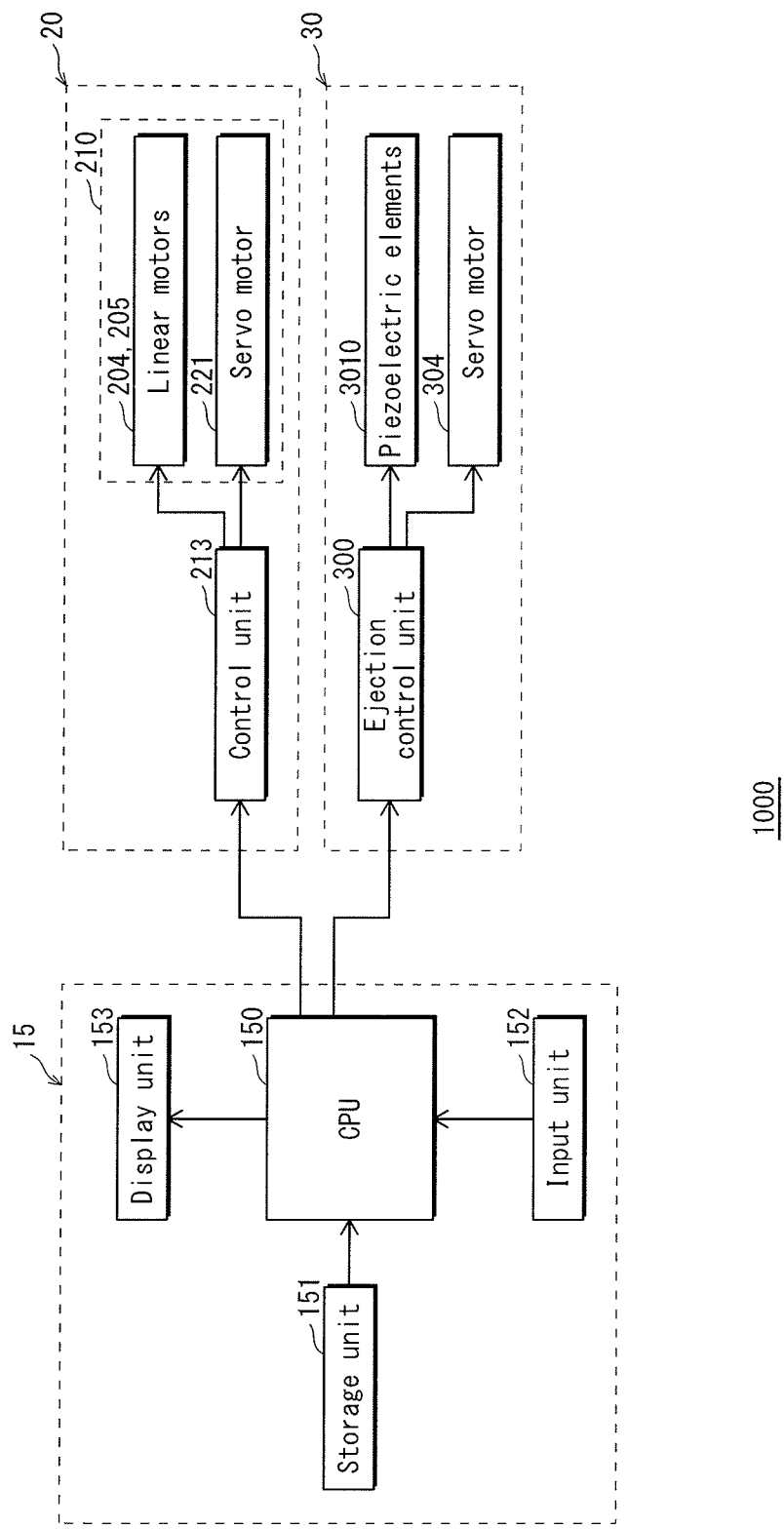
FIG. 2 is a functional block diagram showing the ink jet device 1000.

FIG. 1 shows the primary configuration of the ink jet device 1000 relating to the present embodiment. FIG. 2 is a functional block diagram showing the ink jet device 1000.

As shown in FIG. 1 and FIG. 2, the ink jet device 1000 includes an ink jet table 20, a head unit 30, and a control device 15.

As shown in FIG. 2, the control device 15 includes a CPU 150, a storage unit 151 (including a large-capacity storage unit such as an HDD), a display unit (display) 153, and an input unit 152. One specific example of the control device 15 is a personal computer (PC). The storage unit 151 stores therein control programs and so on for driving the ink jet table 20 and the head unit 30 which are connected to the control device 15. When the ink jet device 1000 is driven, the CPU 150 performs predetermined control based on an instruction input by an operator via the input unit 152 and the control programs stored in the storage unit 151.

Although the ink jet device 1000 is illustrated as including the single head unit 30 having a single ink jet head 301, the configuration of the ink jet device 1000 is not limited to this. Alternatively, the ink jet head 301 may be provided in plural. For example, the single head unit 30 may have a plurality of ink jet heads 301. Alternatively, the plurality of head units 30 each may have one or more ink jet heads 301.

<Ink Jet Table 20>

As shown in FIG. 1, the ink jet table 20 is a so-called gantry work table where a gantry unit (movable frame) is movably disposed along a pair of guiding shafts on a base.

A specific configuration of the ink jet table 20 is as follows. Columnar stands 201A, 201B, 202A and 202B are arranged at the four corners of an upper surface of a plate-like base 200. A fixed stage ST and an ink pan (dish-like container) IP are disposed in an inner region surrounded by the stands 201A, 201B, 202A and 202B. An application target substrate is placed on the fixed stage ST. Immediately before ink is applied to the application target substrate, the ink is ejected into the ink pan IP to stabilize ejection properties.

Furthermore, guiding shafts 203A and 203B are supported by the stands 201A and 201B and the stands 202A and 202B, respectively in such a manner that the guiding shafts 203A and 203B extend in the longitudinal direction of the base 200 (the Y direction) in parallel with each other. The guiding shafts 203A and 203B are inserted through linear motor units 204 and 205, respectively. A gantry unit 210 is mounted on the linear motor units 204 and 205 so as to suspend the guiding shafts 203A and 203B over the linear motor units 204 and 205, respectively. With this configuration, when the ink jet device 1000 is driven, the gantry unit 210 slides back and forth in the longitudinal direction of the guiding shafts 203A and 203B (the Y-axis direction) due to driving of the pair of linear motor units 204 and 205.

The gantry unit 210 is provided with a movable member (carriage) 220 that is composed of an L-shaped mount. The movable member 220 is provided with a servo motor unit (movable motor) 221. Gears which are not illustrated are attached to the tip of the shaft of the servo motor unit 221. The gears fit into a guiding groove 211 extending in the longitudinal direction of the gantry unit 210 (the X direction). A minute rack extending in the longitudinal direction of the gantry unit 210 is disposed inside the guiding groove 211. The gears are engaged with the rack. Accordingly, when the servo motor unit 221 is driven, the movable member 220 moves back and forth with precision in the X-axis direction by a so-called rack and pinion mechanism.

The movable member 220 is provided with the head unit 30. Accordingly, it is possible to control the head unit 30 to scan the application target substrate by moving the gantry unit 210 in the longitudinal direction of the guiding shafts 203A and 203B while the movable member 220 is fixed to the gantry unit 210, or by moving the movable member 220 in the longitudinal direction of the gantry unit 210 while the gantry unit 210 is suspended. The main scanning direction and the sub scanning direction of the head unit 30 are the column (the Y-axis) direction and the row (the X-axis) direction, respectively.

The linear motor units 204 and 205 and the servo motor unit 221 are each connected to the control unit 213 such that the control unit 213 directly controls driving of the linear motor units 204 and 205 and the servo motor unit 221. The control unit 213 is connected to the CPU 150 included in the control device 15. When the ink jet device 1000 is driven, the linear motor units 204 and 205 and the servo motor unit 221 are controlled to drive by the CPU 150, which has read the control programs, via the control unit 213 (see FIG. 2).

<Ink Jet Head 301>

The head unit 30 employs a piezoelectric system, and includes the ink jet head 301 and a body 302. The inkjet head 30 is fixed to the movable member 220 via the body 302. The body 302 has built therein a servo motor unit 304 (see FIG. 2). Rotation of the servo motor unit 304 adjusts an angle between the longitudinal direction of the ink jet head 301 and the X-axis of the fixed stage ST.

Figure 3A:
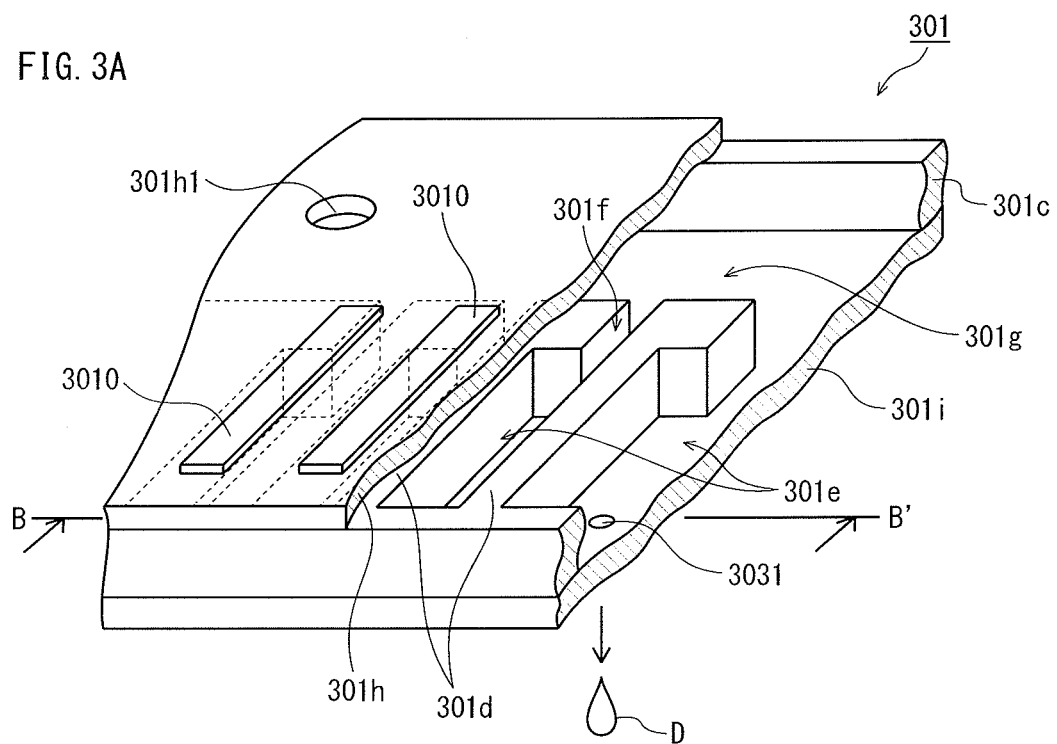
FIG. 3A is a partially cutaway perspective cross-sectional view schematically showing the outline configuration of an ink jet head 301 of the ink jet device 1000.
Figure 3B:
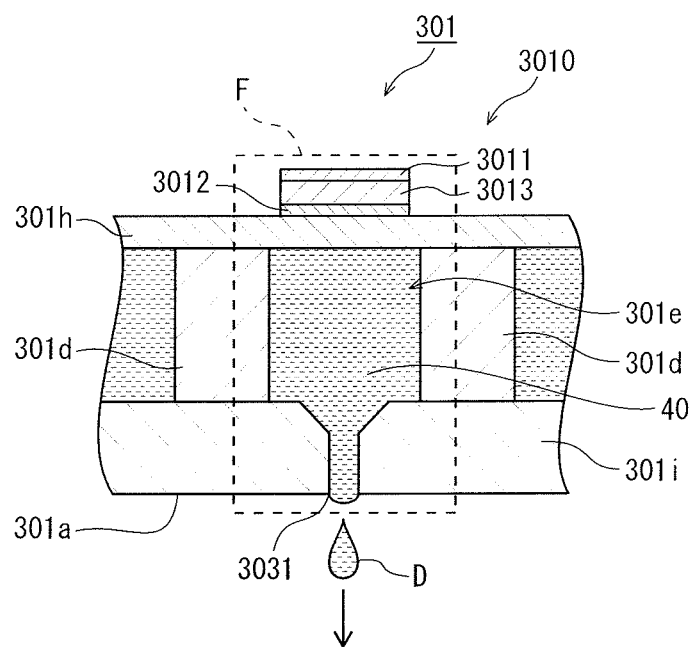
FIG. 3B is a partially enlarged cross-sectional view schematically showing the ink jet head 301.

FIG. 3A is a partially cutaway perspective cross-sectional view showing the outline configuration of the ink jet head 301. FIG. 3B is a partially enlarged cross-sectional view showing the ink jet head 301 taken along a line B-B' in FIG. 3A. As shown in FIG. 3A and FIG. 3B, the ink jet head 301 includes a nozzle plate 301i, a housing plate 301c, and a vibration plate 301h that are overlaid in this order. The nozzle plate 301i has a plurality of nozzles 3031 through which droplets D are ejected. The housing plate 301c has barrier ribs 301d that section ink housing units 301e that are communicated with the respective nozzles 3031. The vibration plate 301h has joined thereto piezoelectric elements 3010 that are pressure application units serving as driving means corresponding to the respective ink housing units 301e.

The housing plate 301c has, in addition to the barrier ribs 301d which section the section ink housing units 301e communicated with the respective nozzles 3031, passages 301f and 301g through which ink is filled in the ink housing units 301e. The passages 301f and 301g are each a space resulting from sandwiching the housing plate 301c, which includes the barrier ribs 301d, between the nozzle plate 301i and the vibration plate 301h. The passage 301g serves as a reservoir in which ink is stored.

Ink is supplied from an ink tank or the like through a pipe, and is stored in the reservoir through a supply hole 301h1 provided in the vibration plate 301h. Then, the ink is stored in the ink housing units 301e through the passage 301f.

As shown in FIG. 3B, the piezoelectric elements (the pressure application units) 3010 are each composed of a pair of electrodes 3011 and 3012 that sandwich an element body 3013 therebetween. When drive voltage is externally applied to the pair of electrodes 3011 and 3012, the vibration plate 301h to which the piezoelectric elements 3010 are joined is deformed. This increases or decreases volume of the ink housing units 301e, which are partitioned by the barrier ribs 301d. As a result, ink 40 that is filled in the ink housing units 301e is increased or decreased in pressure, and liquid material is ejected as droplets D through the nozzles 3031. Then, when application of the drive voltage is stopped, the vibration plate 301h is restored to the original shape, and the volume of the ink housing units 301e is restored. As a result, the ink is sucked from the reservoir to the ink housing units 301e. It is possible to control amount, ejection timing, and so on of the ink to be ejected through the nozzles 3031, by controlling the drive voltage to be applied to the piezoelectric elements 3010.

Note that a region F surrounded by a dashed line in FIG. 3B indicates a cross-section of a region of the ink jet head 301 corresponding to each of the nozzles 3031. The region F is constituted from the ink housing unit 301e, the barrier ribs 301d constituting the ink housing unit 301e, the vibration plate 301*h*, the nozzle plate 301*i*, the piezoelectric element 3010, and the nozzle 3031. In the present embodiment, the number of the nozzles 3031 included in the ink jet heads 301 is plural. However, the present invention is not limited to this configuration at all. Alternatively, the ink jet head 301 may for example have one nozzle 3031 corresponding to only the region F.

The ink jet head 301 has the nozzles 3031 on a surface thereof facing the fixed stage ST. The nozzles 3031 are arranged for example in rows in the longitudinal direction of the ink jet head 301. Ink (liquid material) which is supplied to the ink jet head 301 is ejected through the nozzles 3031 as droplets to the application target substrate.

In the present embodiment, the ink jet device 1000 includes the ink jet head 301 having a single type of ink housed therein. However, the present invention is not limited to this configuration. Alternatively, the ink jet device 1000 may include the plurality of ink jet head units 30, and the ink jet heads 301 included in the ink jet head units 30 may for example one-to-one correspond to different types of ink such that different types of droplets are ejected through the nozzles 3031 of the ink jet heads 301 to the application target substrate.

As described above, droplet ejection operations of the nozzles 3031 are controlled in accordance with the drive voltage to be applied to the piezoelectric elements 3010 included in the nozzles 3031. An ejection control unit 300 controls the drive voltage to be applied to the piezoelectric elements 3010, and as a result predetermined ink droplets are ejected through the nozzles 3031. Specifically as shown in FIG. 2, the CPU 150 reads the predetermined control programs from the storage unit 151, and instructs the ejection control unit 300 to apply defined voltage to the piezoelectric elements 3010. In accordance with this instruction, the ejection control unit 300 controls the drive voltage to be applied to the piezoelectric elements 3010.

In the present embodiment, the vibration plate 301*h* of the ink housing unit 301*e* is deformed by the plate-like piezoelectric elements 3010 which are flexural vibrators. However, the configuration of the vibrators is not limited to this. Alternatively, longitudinal vibrators using rod piezoelectric elements may be for example employed. In this case, the vibration plate 301*h* of the ink housing unit 301*e* is deformed in a deformation direction of rod piezoelectric elements.

<Drive Voltage>

(Waveform Configuration)

The following describes the waveform configuration of drive voltage compared with conventional ones.

Figure 4A:
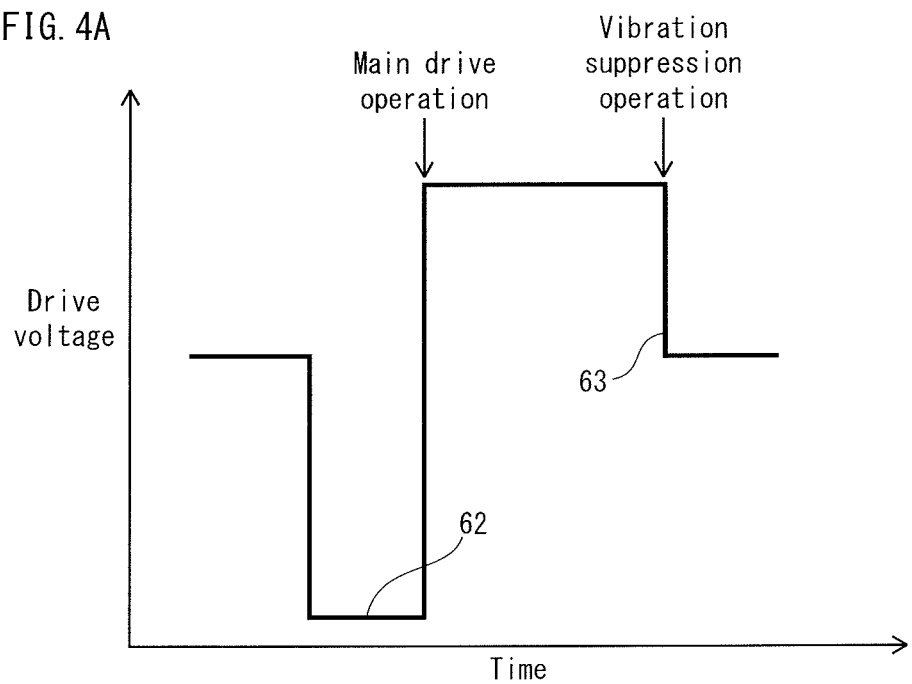
FIG. 4A illustratively shows the configuration of drive waveform of drive voltage in a conventional ink jet device, and FIG. 4B schematically shows, in sections (i) to (iii), ejection behavior of ink upon application of the drive voltage shown in FIG. 4A.
Figure 4B:
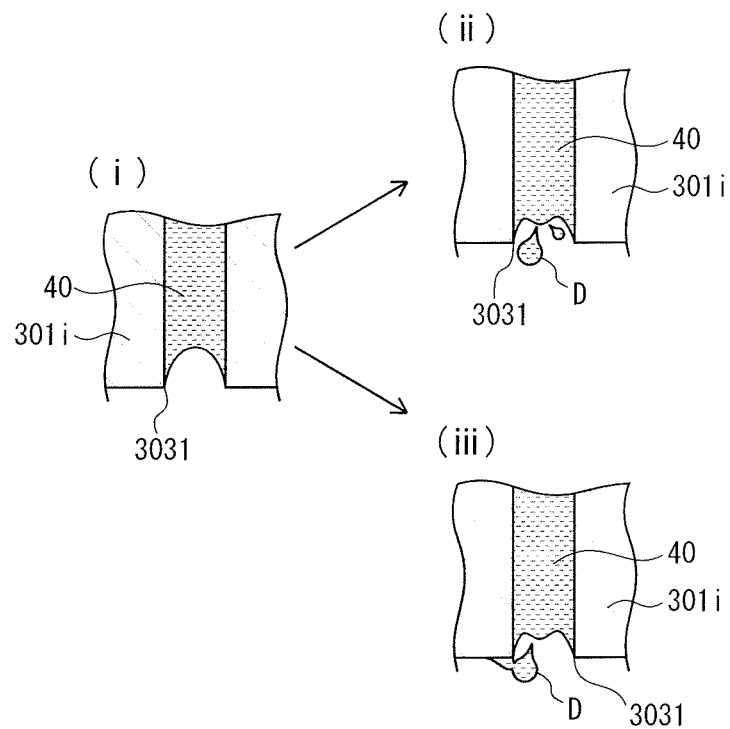
Figure 5A:
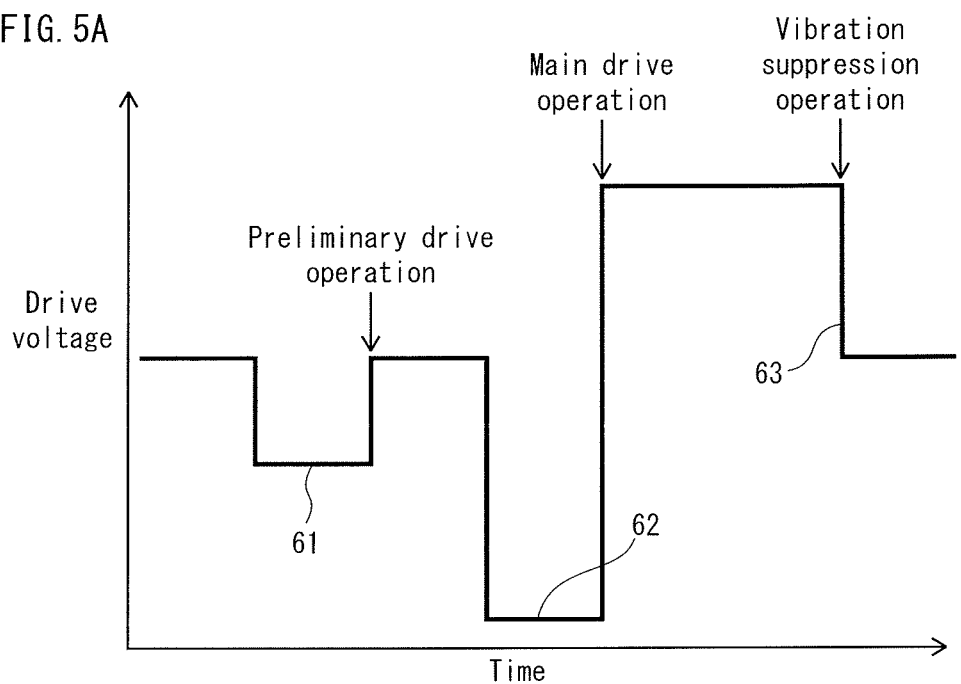
FIG. 5A illustratively shows the configuration of drive waveform of drive voltage in the ink jet device 1000, and FIG. 5B schematically shows, in sections (i) to (iii), ejection behavior of ink upon application of the drive voltage shown in FIG. 5A.
Figure 5B:
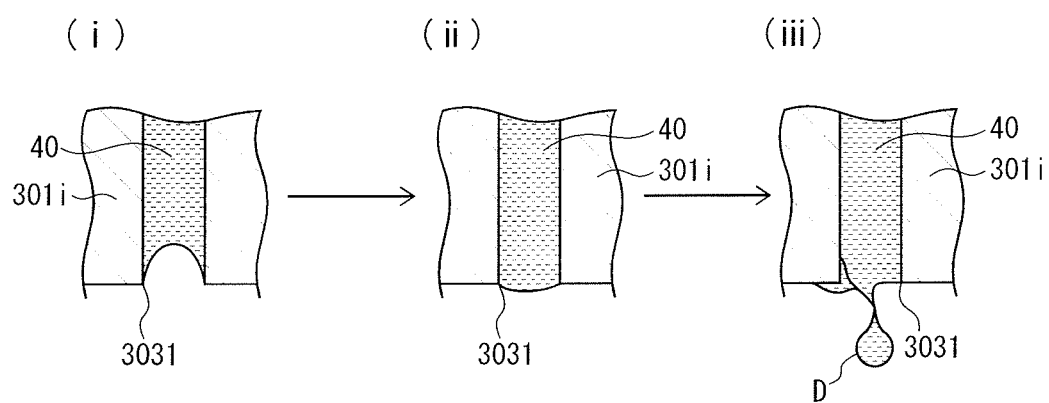

FIG. 4A illustratively shows the configuration of drive waveform of drive voltage in a conventional ink jet device, and FIG. 4B schematically shows ejection behavior of ink upon application of the drive voltage shown in FIG. 4A. FIG. 5A illustratively shows the configuration of drive waveform of drive voltage in the ink jet device 1000 relating to the present embodiment, and FIG. 5B schematically shows ejection behavior of ink upon application of the drive voltage shown in FIG. 5A. FIG. 4B and FIG. 5B each show only the vicinity of the nozzle 3031 extracted from FIG. 3B.

The drive waveform of the drive voltage shown in FIG. 4A includes a main vibration waveform part 62 and a vibration suppression waveform part 63. The main vibration waveform part 62 is a waveform part for performing a main drive operation by a so-called pull ejection according to which ink droplet is ejected by first increasing the volume of the ink housing unit to expand the ink housing unit, and then decreasing the volume of the ink housing unit to shrink the ink housing unit. The vibration suppression waveform part 63 is a waveform part for performing a vibration suppression operation to suppress vibration that remains on an ink surface due to the main drive operation. At an application start time of drive voltage corresponding to the main vibration waveform part 62, the ink 40 is located inside the ink housing units 301*e* while the ink surface is distant from the outer edge of the nozzle 3031 (section (i) in FIG. 4B). Accordingly, when the drive voltage corresponding to the main vibration waveform part 62 is applied, ununiform positive pressure is applied to the ink surface. This might result in that a droplet having a smaller volume than the defined volume is ejected, or that such a droplet is ejected in various directions (section (ii) in FIG. 4B). Also, since ejection of a droplet having the defined volume is impossible, excessive drive voltage might need to be applied in order to increase the volume of the droplet. Furthermore, a failure is likely to occur that a subsequent ink droplet comes into contact with ink adhered to the vicinity of the nozzle 3031, and the subsequent droplet is ejected in a bent direction due to surface tension (section (iii) in FIG. 4B).

More detailed description is given as follows. When the drive voltage corresponding to the main vibration waveform part 62 is applied, the ink surface at a time immediately before ejection has a meniscus shape that is curved toward inside the ink housing unit 301*e* as shown in section (i) in FIG. 4B. Accordingly, the positive pressure applied to the ink surface is ununiform, and amplitude is the highest around the vertex of the meniscus shape. As a result, a droplet D having a smaller volume than the defined volume is ejected, or the droplet D is ejected in the various directions (section (ii) in FIG. 4B). Therefore, since ejection of the droplet having the defined volume is impossible, excessive drive voltage might need to be applied in order to increase the volume of the droplet D.

The drive waveform of the drive voltage shown in FIG. 5A includes a preliminary vibration waveform part 61, a main vibration waveform part 62, and a vibration suppression waveform part 63. The preliminary vibration waveform part 61 is a waveform part for performing a preliminary drive operation by first increasing the volume of the ink housing unit 301*e* to expand the ink housing unit 301*e*, and then decreasing the volume of the ink housing unit 301*e* to shrink the ink housing unit 301*e*. The main vibration waveform part 62 and the vibration suppression waveform part 63 are the same as those shown in FIG. 4A. In the preliminary drive operation, the ink 40 is pushed toward the outer edges of the nozzles 3031, and as a result the ink 40 is changed from the state shown in section (i) in FIG. 5B to the state shown in section (ii) in FIG. 5B. Accordingly, when drive voltage corresponding to the main vibration waveform part 62 is applied, positive pressure applied to the ink surface is uniform, and this increases volume of a droplet of the ink 40 to be ejected. Also, as the volume of the droplet of the ink 40 to be ejected increases, motion energy of the droplet increases. Accordingly, even when a subsequent droplet comes into contact with an ink droplet adhering to the vicinity of the nozzle 3031, the subsequent droplet is less influenced by surface tension, and is ejected with high straightness. This prevents the droplet from being ejected in a bent direction (section (iii) in FIG. 5B).

More detailed description is given as follows. The preliminary vibration waveform part 61 is a waveform part for performing the preliminary drive operation to flatten the meniscus shape by pushing the ink. At a time immediately before the preliminary drive operation through application of the drive voltage corresponding to the preliminary vibration waveform part 61, the ink surface has a meniscus shape that is curved toward inside the ink housing unit 301*e* as shown in section (i) in FIG. 5B. However, the meniscus shape of the ink surface is flattened through the preliminary drive operation (section (ii) in FIG. 5B). When the drive voltage corresponding to the main vibration waveform part 62 is applied, the ink surface at a time immediately before ejection has the meniscus shape that is flattened as described above. Accordingly, the positive pressure applied to the ink surface is uniform, and the amplitude around the vertex of the meniscus shape is smaller than in the case where the meniscus shape is not flattened. This increases the volume of the droplet to be ejected.

The ink jet device 1000 relating to the present embodiment includes the single ink jet head 301 having the plurality of nozzles 3031. The drive voltage corresponding to the drive waveform shown in FIG. 5A is applied with respect to at least one of the nozzles 3031. The drive waveform includes the preliminary vibration waveform part, the main vibration waveform part, and the vibration suppression waveform part. Since the drive voltage corresponding to the preliminary vibration waveform part, which is independent from the drive voltage corresponding to the main vibration waveform part, is applied prior to the drive voltage corresponding to the main vibration waveform part, it is possible to perform wide-range control on the volume of the droplet to be ejected.

Note that the respective drive voltages corresponding to the main vibration waveform part and the vibration suppression waveform part such as exemplified in FIG. 4A may be applied with respect to the remaining nozzles 3031, without performance of the preliminary drive operation.

The preliminary drive operation is performed with respect to the nozzle 3031 through which the ink having the defined volume is not ejected. For example, the nozzle 3031 to be targeted is determined in accordance with manufacturing irregularities of the components constituting the ink housing unit 301e such as the vibration plate 301h and the nozzle 3031, the components constituting the pressure application units 3010, and so on. Specifically, suppose a case where inequality exists between the nozzles 3031 in volume of an ink droplet to be ejected due to the manufacturing irregularities. When the largest volume of an ink droplet among ink droplets having unequal volumes falls within a defined droplet volume range for example, the largest volume is determined as a reference value. Then, the drive voltage corresponding to the preliminary vibration waveform part is applied to the respective pressure application units corresponding to the remaining nozzles 3031 to perform the preliminary drive operation such that the volume of the ink droplet in the remaining nozzles 3031 are equal to the largest volume determined as the reference value. Also, when a defined ink droplet volume falls within a range of unequal volumes of ink droplets, drive voltage to be applied for ejecting the defined volume droplet (drive voltage corresponding to the main vibration waveform part) is determined as a reference value. Then, drive voltage including drive voltage corresponding to the main vibration waveform part, which is increased or decreased from the reference value by some volts, and drive voltage corresponding to the preliminary vibration waveform part is applied to the respective pressure application units corresponding to the remaining nozzles 3031 to perform the preliminary drive operation. Although described later, by using the drive voltage having the waveform configuration including the preliminary vibration waveform part and varying the displacement amount of the drive voltage corresponding to the preliminary vibration waveform part, it is possible to obtain droplet volume in a wide range only with variation of drive voltage corresponding to the main vibration waveform part in a minute range of some volts (see FIG. 8B shown later). For this reason, the respective displacement amounts of application drive voltages corresponding to the preliminary vibration waveform part and the main vibration waveform part should be appropriately adjusted depending on the status of inequality in droplet volume.

The ink jet device 1000 relating to the present embodiment includes the single ink jet head 301. Alternatively, in the case where the ink jet device 1000 includes a plurality of ink jet heads, drive voltage, which has the drive waveform including the preliminary vibration waveform part, the main vibration waveform part, and the vibration suppression waveform part, may be applied with respect to at least one of the ink jet heads or one of the nozzles of the at least one ink jet head. Note that the drive voltage corresponding to the drive waveform including the main vibration waveform part and the vibration suppression waveform part exemplified in FIG. 4A may be applied with respect to the remainder of the ink jet heads or nozzles, without performance of the preliminary drive operation.

Also, in the present embodiment, the drive voltage corresponding to the main vibration waveform part is applied for performing the main drive operation by the pull ejection method. Alternatively, the main drive operation may be performed by the push ejection method for shrinking the ink housing unit 301e without being expanded once, and the drive voltage corresponding to the main vibration waveform part may be applied as such. In this case, drive waveform of the drive voltage is as exemplified in FIG. 6A. Also, in the present embodiment, the drive waveform of the drive voltage includes the vibration suppression waveform part. However, this is not an essential element, and the drive waveform of the drive voltage may include only the preliminary vibration waveform part and the main vibration waveform part such as exemplified in FIG. 6B. Furthermore, in the present embodiment, the drive voltage corresponding to the preliminary vibration waveform part is applied for performing the preliminary drive operation by the pull ejection method. Alternatively, the drive voltage corresponding to the preliminary vibration waveform part may be applied by the push ejection method for shrinking the ink housing unit 301e without being expanded once. In this case, drive waveform of the drive voltage is as exemplified in FIG. 6C. As described above, the waveform configuration of the drive voltage is not limited to that shown in the present embodiment, and only needs to have the waveform configuration including the preliminary vibration waveform part for performing the preliminary drive operation to pushing ink toward the outer edge of the nozzle and the main vibration waveform part subsequent to the preliminary vibration waveform part for ejecting an ink droplet.

(Displacement Amount and Waveform Width of Application Drive Voltage)

Figure 7:
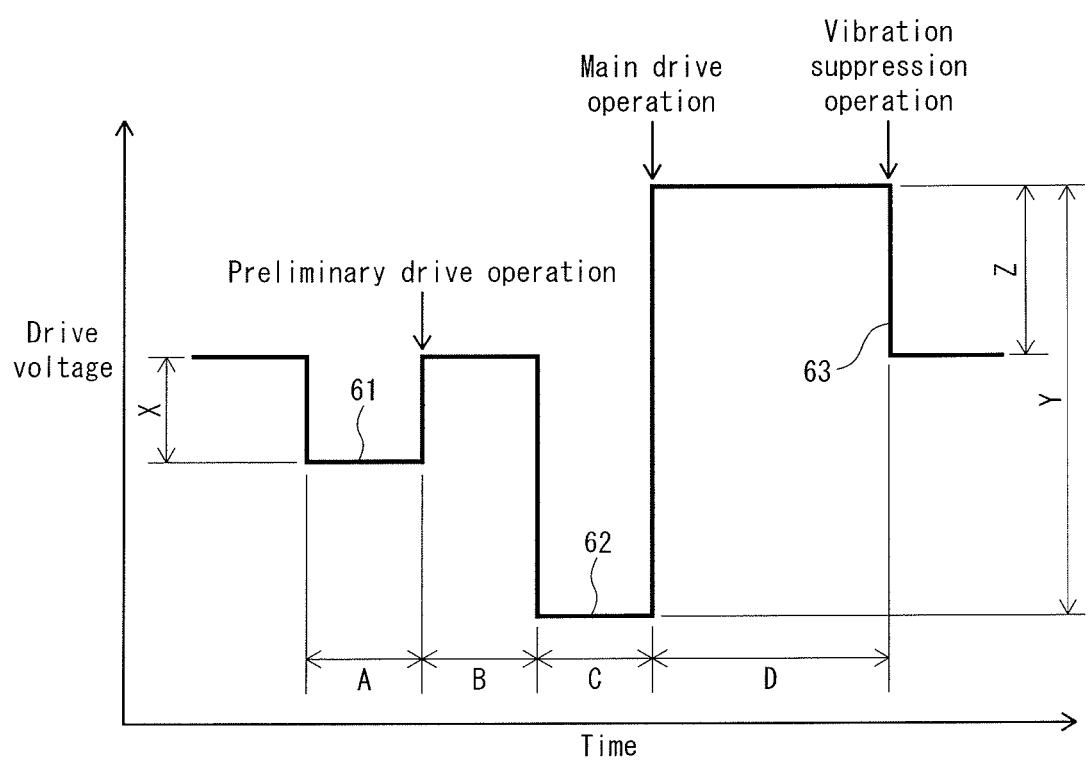
FIG. 7 shows waveform configuration and shape of drive voltage in the ink jet device 1000.

FIG. 7 shows drive waveform of drive voltage used in the present embodiment. In FIG. 7, the preliminary vibration waveform part 61, the main vibration waveform part 62, and the vibration suppression waveform part 63 have waveform widths A, B, and C, respectively, and voltages applied for performing the preliminary drive operation, the main drive operation, and the vibration suppression operation have displacement amounts X, Y, and Z, respectively.

The following describes the displacement amount and the drive waveform width with respect to each of the preliminary vibration waveform part, the main vibration waveform part, and the vibration suppression waveform part.

<Preliminary Vibration Waveform Part>

Drive voltage corresponding to the preliminary vibration waveform part is applied for performing the preliminary drive operation. The lower limit of the displacement amount X of application drive voltage corresponding to the preliminary vibration waveform part should be a value necessary for pushing ink to the extent that an ink droplet having the defined volume can be ejected in the main drive operation. The upper limit of the displacement amount X should be a value to the extent that an ink droplet is not ejected in the preliminary drive operation. Accordingly, taking into consideration that the displacement amount Y of the application drive voltage necessary for ejecting the ink droplet varies depending on physical properties of the ink, a preferable range of the displacement amount X of the application drive voltage is set in relation to the displacement amount Y of the application drive voltage to ensure that 20%≤X/Y≤40% is satisfied. The displacement amount Y of application drive voltage generally falls within a range of 10V to 50V.

More specifically, the lower limit of the displacement amount X of the application drive voltage should be a value that allows to flatten the meniscus shape of the ink surface to the extent that an ink droplet having the defined volume is ejected in the main drive operation. Accordingly, a preferable range of the displacement amount X is set to ensure that 20%≤X/Y is satisfied. The upper limit of the displacement amount X is set to ensure that 20%≤X/Y≤40% is satisfied.

The waveform width A of the preliminary vibration waveform part is set such that vibration that remains on the ink surface due to the main drive operation or vibration that occurs due to application of drive voltage corresponding to the preliminary vibration waveform part for expanding the ink housing unit does not resonate with vibration that occurs due to application of drive voltage for shrinking the ink housing unit 301e in the preliminary drive operation. The waveform width A is for example set to T/2 that is half a period T of the helmholtz resonance frequency in the ink housing unit 301e.

Figure 6A:
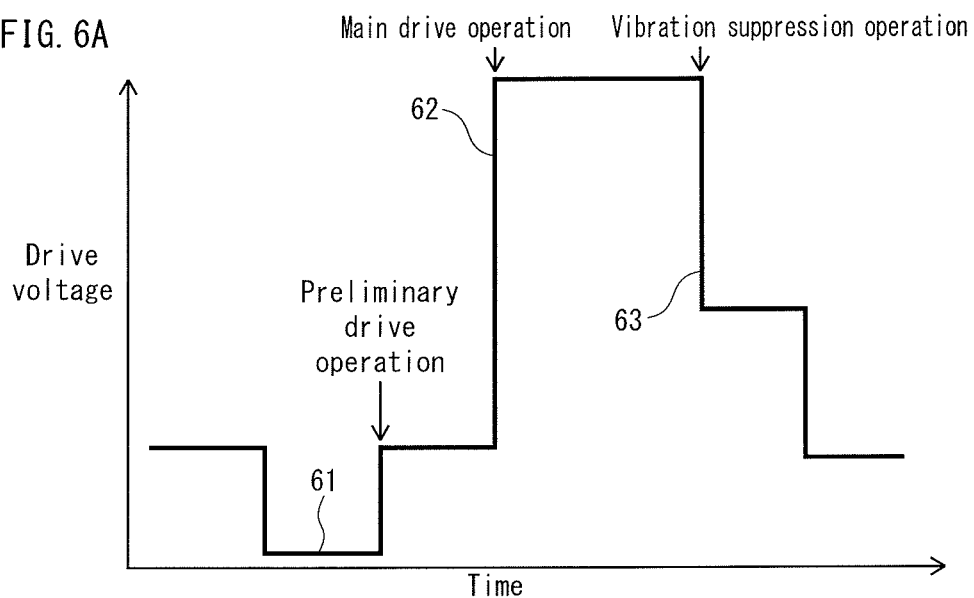
FIGS. 6A, 6B, and 6C show examples of drive waveform of drive voltage in the ink jet device 1000, where
Figure 6B:
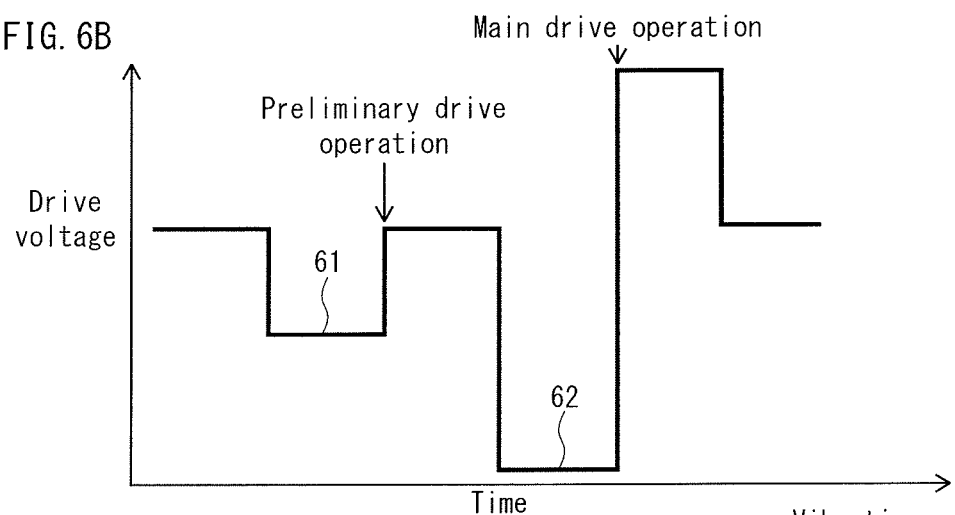
Figure 6C:
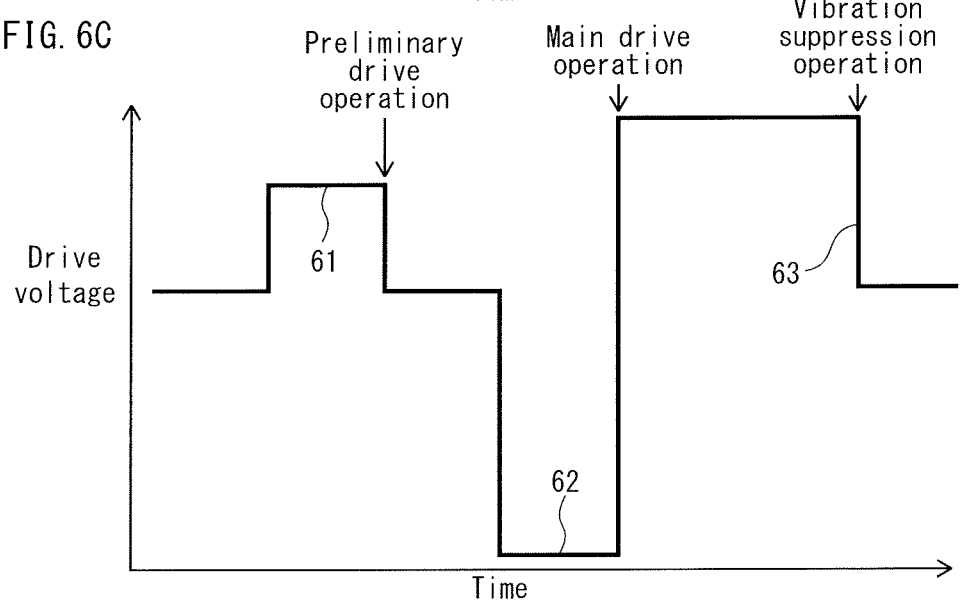

In the present embodiment, the drive voltage corresponding to the preliminary vibration waveform part is applied for performing the preliminary drive operation by the pull ejection method. Alternatively, the drive voltage corresponding to the preliminary vibration waveform part may be applied for performing the preliminary drive operation by the push ejection method as shown in FIG. 6C. In this case, the values of the displacement amount and waveform width of the drive voltage may be used that are the same as those in the present embodiment. Note that the preliminary drive operation by the pull ejection method is advantageous in that an application period necessary for one cycle of waveform is reduced. This is because the preliminary drive operation by the pull ejection method allows to push ink at a low drive voltage compared with the preliminary drive operation by the push ejection method, thereby reducing the displacement amount of application drive voltage.

<Main Vibration Waveform Part>

Drive voltage corresponding to the main vibration waveform part is applied for performing the main drive operation. The displacement amount Y of the application drive voltage corresponding to the main vibration waveform part is set in accordance with the physical properties of the used ink such that ink droplets are ejected in the main drive operation. In the present embodiment, since the preliminary drive operation is performed prior to the main drive operation, it is possible to uniformize positive pressure to be applied to the ink surface in the main drive operation. Accordingly, the displacement amount Y of the application drive voltage is suppressed low compared with the case where the preliminary drive operation is not performed, and driving at this low drive voltage allows to reduce an application period necessary for one cycle of waveform.

The waveform width C of the main vibration waveform part is set such that vibration that remains on the ink surface due to application of the drive voltage corresponding to the preliminary vibration waveform part does not resonate with vibration that occurs due to the main drive operation. The waveform width C is for example set to T/2 that is half the period T of the helmholtz resonance frequency in the ink housing unit.

In the present embodiment, the drive voltage corresponding to the main vibration waveform part is applied for performing the main drive operation by the pull ejection method. Alternatively, the drive voltage corresponding to the main vibration waveform part may be applied for performing the main drive operation by the push ejection method as shown in FIG. 6A. In this case, the values of the displacement amount and waveform width of the drive voltage may be used that are the same as those in the present embodiment. Note that the main drive operation by the pull ejection method is advantageous in that an application period necessary for one cycle of waveform is reduced. This is because the main drive operation by the pull ejection method allows to eject ink droplets at a low drive voltage compared with the main drive operation by the push ejection method, thereby reducing the displacement amount of application drive voltage.

<Vibration Suppression Waveform Part>

Drive voltage corresponding to the vibration suppression waveform part is opposite to the drive voltage corresponding to the main vibration waveform part, and is applied for suppressing amplitude of vibration remaining on the ink surface due to the main drive operation. Taking into consideration the relationship with the displacement amount Y of the application drive voltage corresponding to the main vibration waveform part, a preferable range of the displacement amount Z of the application drive voltage corresponding to the vibration suppression waveform part is set to ensure that 30%≤Z/Y is satisfied. This preferably suppresses the amplitude of vibration that remains on the ink surface due to the main drive operation. The upper limit of the displacement amount Z is not particularly limited. However, since increase in displacement amount of application drive voltage increases an application period necessary for one cycle of waveform, the upper limit of the displacement amount Z should be set such that Z/Y≤60% is satisfied.

Also, in the case where the waveform configuration of drive voltage in the present embodiment shown in FIG. 7 is used, which includes the preliminary vibration waveform part 61, the main vibration waveform part 62, and the vibration suppression waveform part 63, relationship X/Y+Z/Y≤100% needs to be satisfied. Accordingly, the upper limit of the proportion in displacement amount Z/Y is also defined in accordance with the proportion in displacement amount X/Y relating to the application drive voltage which is necessary for performing the preliminary drive operation.

The waveform width D of the vibration suppression waveform part is set such that vibration that occurs due to the vibration suppression operation does not resonate with vibration that remains on the ink surface due to application of drive voltage corresponding to the main vibration waveform part, and furthermore such that amplitude of the remaining vibration is attenuated as much as possible. The waveform width D is for example set to T/2 that is half the period T of the helmholtz resonance frequency in the ink housing unit.

In the present embodiment, the waveform configuration of application drive voltage includes the vibration suppression waveform part. However, the vibration suppression waveform part is not essential. Also in the present embodiment, the drive voltage corresponding to the vibration suppression waveform part is applied as shown in FIG. 7 such that there is no displacement amount between the drive voltage corresponding to the vibration suppression waveform part and the drive voltage corresponding to the preliminary vibration waveform part. In other words, when the vibration suppression operation is started, the drive voltage is immediately decreased to the drive voltage at the start time of the preliminary drive operation. However, the drive voltage corresponding to the vibration suppression waveform part is not limited to being applied in this way. Alternatively, the drive voltage corresponding to the vibration suppression waveform part may be applied such as shown in FIG. 6A such that the displacement amount Z gradually increases step by step between the drive voltage corresponding to the preliminary vibration waveform part and the drive voltage corresponding to the vibration suppression waveform part. Further alternatively, the drive voltage corresponding to the vibration suppression waveform part may be applied such that the vibration suppression waveform part have a rectangle shape by performing the vibration suppression operation at the displacement amount Z having a larger value than the displacement amount Z shown in FIG. 7, keeping the drive voltage for a certain period, and then applying the drive voltage corresponding to the vibration suppression waveform part until immediately before application of the drive voltage corresponding to the preliminary vibration waveform part.

<Others>

The wave configuration of the application drive voltage in the present embodiment includes the preliminary vibration waveform part, which is independent from the main vibration waveform part. Accordingly, there is a relay period B between the application period of the drive voltage corresponding to the preliminary vibration waveform part and the application period of the drive voltage corresponding to the main vibration waveform part. The relay period B is set such that vibration that remains on the ink surface due to application of the drive voltage corresponding to the preliminary vibration waveform part does not resonate with vibration that occurs due to application of the drive voltage corresponding to the main vibration waveform part for expanding the ink housing unit. The relay period B is for example set to T/2 that is half the period T of the helmholtz resonance frequency in the ink housing unit.

In the case where there is a relay period between the application period of the drive voltage corresponding to the preliminary vibration waveform part and the application period of the drive voltage corresponding to the main vibration waveform part, and or between the application period of the drive voltage corresponding to the main vibration waveform part and the application period of the drive voltage corresponding to the vibration suppression waveform part, the relay period should be set such that vibration that remains on the ink surface due to previous or immediately previous application of drive voltage does not resonate with vibration that occurs on the ink surface due to subsequent application of drive voltage. The relay period should be preferably for example set to T/2 that is half the period T of the helmholtz resonance frequency in the ink housing unit.

<Experiment and Analysis>

(Effects of Increase in Volume of Ink Droplet to be Ejected Owing to Preliminary Drive Operation)

As described above, the present inventor found the expertise that volume of an ink droplet to be ejected is increased by pushing ink toward the outer edge of the nozzle to the extent that the ink droplet is not ejected, more specifically by flattening the meniscus shape of the ink surface, prior to the drive operation for ejecting the ink droplet. Then, the present inventor reached a conclusion that, by controlling application drive voltage for pushing the ink toward the outer edge of the nozzle to the extent that the ink droplet is not ejected, it is possible to perform wide-range control on the volume of the ink droplet without varying the application drive voltage as much as possible. The following describes results of a verification experiment that lead to the above conclusion with reference to FIG. 8A and FIG. 8B.

Figure 8A:
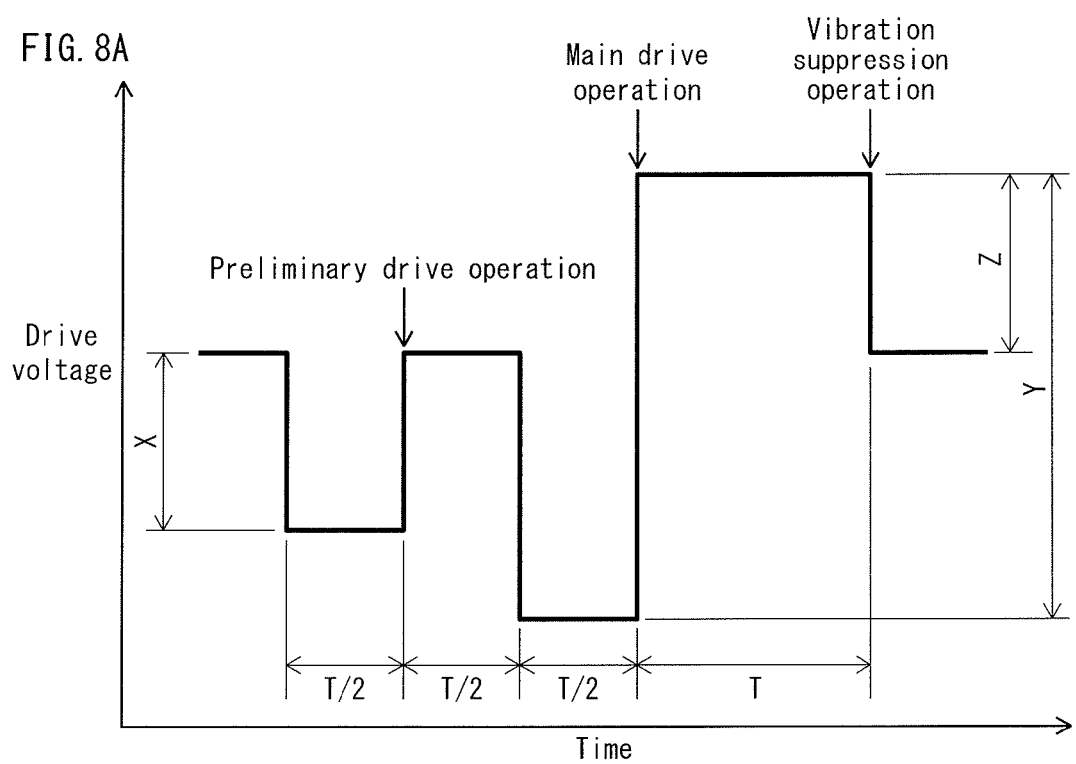
FIG. 8A shows drive waveform of drive voltage used in a verification experiment.
Figure 8B:
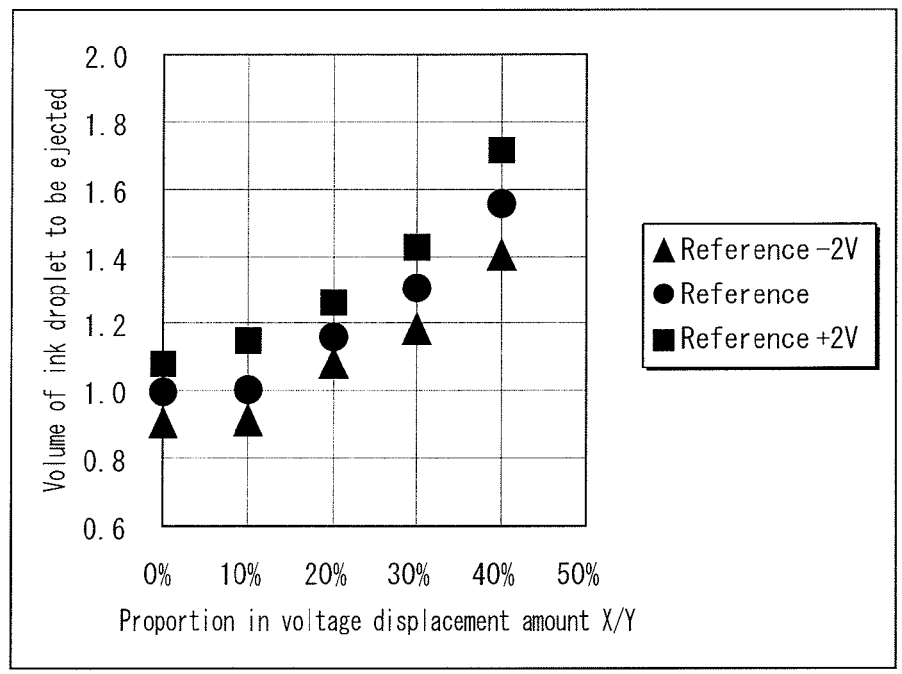
FIG. 8B shows correlation between a proportion in displacement amount X/Y and volume of an ink droplet to be ejected, where X indicates a displacement amount of drive voltage for performing the preliminary drive operation, and Y indicates a displacement amount of drive voltage for performing the main drive operation.

FIG. 8A shows drive waveform of drive voltage used in the verification experiment. FIG. 8B shows correlation between the proportion in displacement amount X/Y and volume of an ink droplet to be ejected, where X indicates the displacement amount of the drive voltage for performing the preliminary drive operation, and Y indicates the displacement amount of the drive voltage for performing the main drive operation. In the verification experiment, driving voltage having the same waveform configuration as that shown in FIG. 7 was applied, which includes the preliminary vibration waveform part for performing the preliminary drive operation, the main vibration waveform part for performing the main drive operation, and the vibration suppression waveform part for performing the vibration suppression operation.

In the verification experiment, an ink jet head was used, which includes an ink housing unit having a nozzle with diameter of 20 μm, and the cycle T of the Helmholtz resonance frequency in the ink housing unit was 6 μs. Waveform width of each of the waveform parts and relay time between the application period of the drive voltage corresponding to the preliminary vibration waveform part and the application period of the drive voltage corresponding to the main vibration waveform part were set in accordance with the cycle T. Also, the displacement amount Z of the drive voltage for performing the vibration suppression operation was set such that Z/Y=40% is satisfied. The displacement amount Y of the drive voltage was set so as to be a value (black rectangle in the figure) greater by 2 V than a reference voltage value (black circle in the figure) and a value (black triangle in the figure) smaller by 2 V than the reference voltage value. Frequency of the drive voltage was set to 1 kHz so as not to be influenced by repetition of ink drop ejection. Volume of an ink droplet to be ejected shown in FIG. 8B was measured by spot observation through magnification photographing using a microscope provided with a high-speed camera. Specifically, the volume of the ink droplet was obtained by calculating area of a region having a value darker than an appropriate threshold value from a lateral image of a spherical droplet, and converting the calculated area into a three-dimensional volume. The threshold value is manually adjusted so as to be equivalent to the outer periphery of the droplet with reference to the lateral image.

The inks used in the verification experiment have solute (organic material) concentration of 5% by weight or lower, viscosity of 30 mPa·s or lower, and surface tension of 20 mN/m to 70 mN/m. The ink used in the verification experiment in FIG. 8B contains CHB (cyclohexylbenzene) as solvent, and contains F8-F6 (copolymer of F8 (poly dioctylfluorene) and F6 (poly dihexylfluorene)) as solute having weight-average molecular weight of 200000 and concentration of 0.6% by weight. The ink has viscosity of 9.8 mP·s, surface tension of 34 mN/m, and ligament length of 162 μm that is length of a linear trail extending backward from part of the ejected ink droplet. The ligament length was measured by spot observation of the flying ink droplet through magnification photographing using a microscope provided with a high-speed camera. The viscosity and the surface tension were measured under the conditions of 20 degrees C. with use of the rheometer AR-G2 manufactured by TA Instruments, Inc.

In the verification experiment, with respect to each of ink samples for the verification experiment, 30 droplets were ejected through each of 10 nozzles having the same diameter in order to check reproducibility of the results of the verification experiment. Data points of the volume of the ink droplet to be ejected shown in the figure each indicate a mean value of the results of the experiment that is equivalent to a value normalized with use of the volume of the ink droplet of 1.0 when the proportion in displacement amount X/Y is set to 0% relative to the reference voltage value.

As shown in FIG. 8B, the volume of the ink droplet to be ejected increased in accordance with increase of the proportion in displacement amount X/Y. A trend was observed that an increase curve of the volume of the ink droplet relative to the displacement amount X/Y shows that when the proportion in displacement amount X/Y is 20% or higher, an increase rate of the volume of the ink droplet increases. Also, a trend was observed that since the drive voltage Y is minutely varied within the range of ±2 V of the reference voltage value, the range of the volume of the ink droplet increases relative to the proportion in displacement amount X/Y. Specifically, the range of the volume of the ink droplet of approximately 2 at the proportion in displacement amount X/Y of 0% increases to approximately 3 at the proportion in displacement amount X/Y of 40%.

As described above, the verification experiment demonstrated that volume of an ink droplet to be ejected effectively increases by setting the proportion in displacement amount X/Y to 20% or higher. When the proportion in displacement amount X/Y exceeded 40%, a phenomenon was observed that application of the drive voltage corresponding to the preliminary vibration waveform part causes an ink droplet to be ejected through the nozzle. In view of this, the displacement amount X/Y should be set to a range of 20% to 40%. Also, the verification experiment demonstrated that it is possible to perform wide-range control on the volume of the ink droplet to be ejected, by suppressing variation of drive voltage, minutely varying the drive voltage Y, and using the proportion in displacement amount X/Y as a variable.

(Optimization of Flight Speed of Ink Droplet)

Flight speed of an ink droplet relates to landing accuracy of the ink droplet. The displacement amount Y was set to each of the reference voltage value, a value greater than the reference voltage value by 2 V, and a value smaller than the reference voltage value by 2 V. The proportion in displacement amount X/Y was varied within the range of 20% to 40% and flight speed of an ink droplet was measured with respect to each of these values of the displacement amount Y. Verification experiment was made on angle inequality in ejection direction relating to a landing position and whether a micro droplet (mist) is generated backward in the ejection direction. The angle inequality is a preferable parameter for judging the landing accuracy. Results of the verification experiment are shown in FIG. 9A, FIG. 9B, FIG. 10A, and FIG. 10B.

In the verification experiment, the conditions for the verification experiment, which include the type of ink, the configuration of the ink jet head, the drive voltage, and so on, were the same as those described in the section (Effects of Increase in Volume of Ink Droplet to be Ejected owing to Preliminary Drive Operation). The angle inequality and the flight speed were measured by spot observation of the flying ink droplet through magnification photographing using a microscope provided with a high-speed camera. The angle inequality was obtained by measuring a value from observation data where angle of 0 is defined in the case where an ink droplet ejected through the nozzle travels straight toward an application target substrate. The flight speed was obtained by measuring a flight distance per constant period from observation data. In the verification experiment, with respect to each of ink samples for the verification experiment, 30 droplets were ejected through each of 10 nozzles having the same diameter in order to check reproducibility of the results of the verification experiment. Data points of the volume of the ink droplet shown in the figure each indicate a relative value resulting from normalizing the standard deviation of the results of the verification experiment (angle inequality) or a mean value of the results of the verification experiment (flight speed).

Figures 9A, 9B:
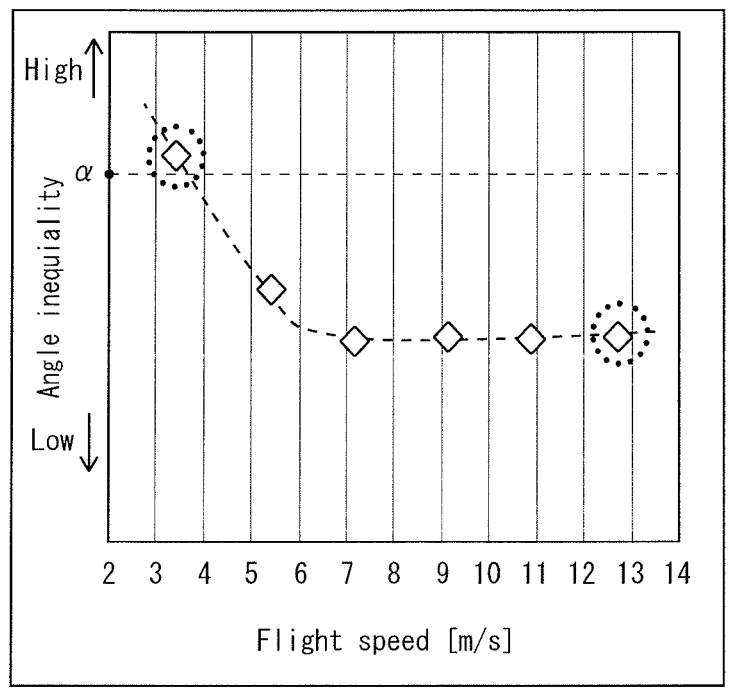
FIG. 9A shows correlation between flight speed of an ink droplet and angle inequality.
FIG. 9B shows the angle inequality relative to the flight speed and results of a verification experiment on generation of micro droplets.

The ink used in the verification experiment in FIG. 9A and FIG. 9B is the same as that shown in FIG. 8B. The ink used in the verification experiment in FIG. 10A and FIG. 10B is the same as that shown in FIG. 8B in terms of solute, solvent, and solute weight-average molecular weight, and has solute concentration of 0.3% by weight, viscosity of 6.1 mP·s, surface tension of 34 mN/m, and ligament length of 106 μm.

Figures 10A, 10B:
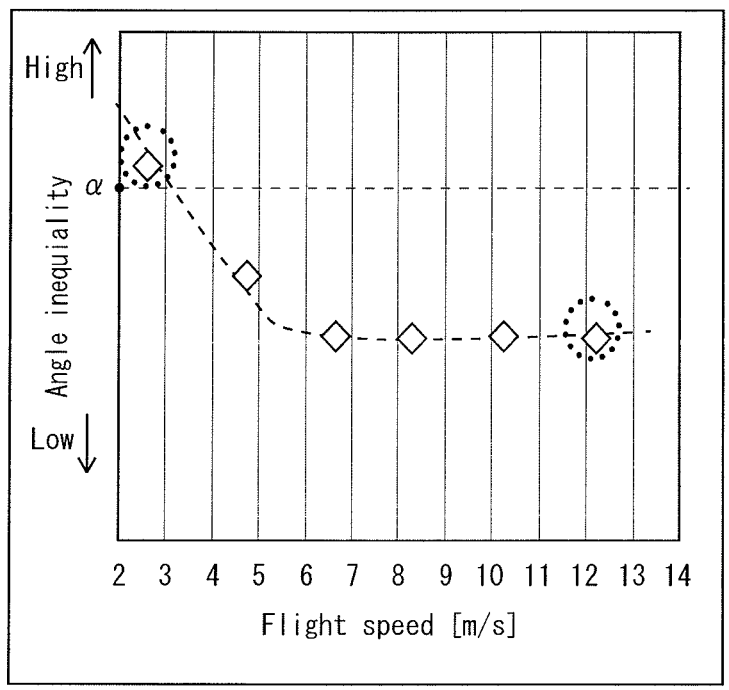
FIG. 10A shows correlation between flight speed of an ink droplet and angle inequality.
FIG. 10B shows the angle inequality relative to the flight speed and results of a verification experiment on generation of micro droplets.

As shown in FIG. 9A and FIG. 10A, the angle inequality of the ink droplet to be ejected rapidly increased in accordance with decrease in flight speed of the ink droplet to be ejected. When the angle inequality is equal to or lower than a standard value α, excellent landing accuracy is realized with few shift width in landing position. FIG. 9B and FIG. 10B are each a table showing whether angle inequality relative to each flight speed is satisfactory or unsatisfactory for the standards. As shown in these tables, when the flight speed is equal to or higher than 4 m/s, the angle inequality is satisfactory for the standards, and accordingly excellent landing accuracy is realized.

As shown in FIG. 9A and FIG. 10A, the angle inequality of the ink droplet to be ejected decreased in accordance with increase in flight speed of the ink droplet. This ensures straight flight of the ink droplets. However, visual spot observation of flight demonstrated that when the flight speed increases over a certain range, a micro droplet (mist) is generated backward in the ejection direction. FIG. 9B and FIG. 10B are each a table showing whether micro droplet is generated. As shown in these tables, when the flight speed is 10 m/s or lower, generation of micro droplets is suppressed, and accordingly excellent landing accuracy is realized.

Embodiment 2

Before description is given on a manufacturing method of an organic EL device relating to the present embodiment, description is given on the configuration of an organic EL device to be manufactured by the manufacturing method relating to the present embodiment.

<Configuration of Organic EL Device 100>

Figure 11:
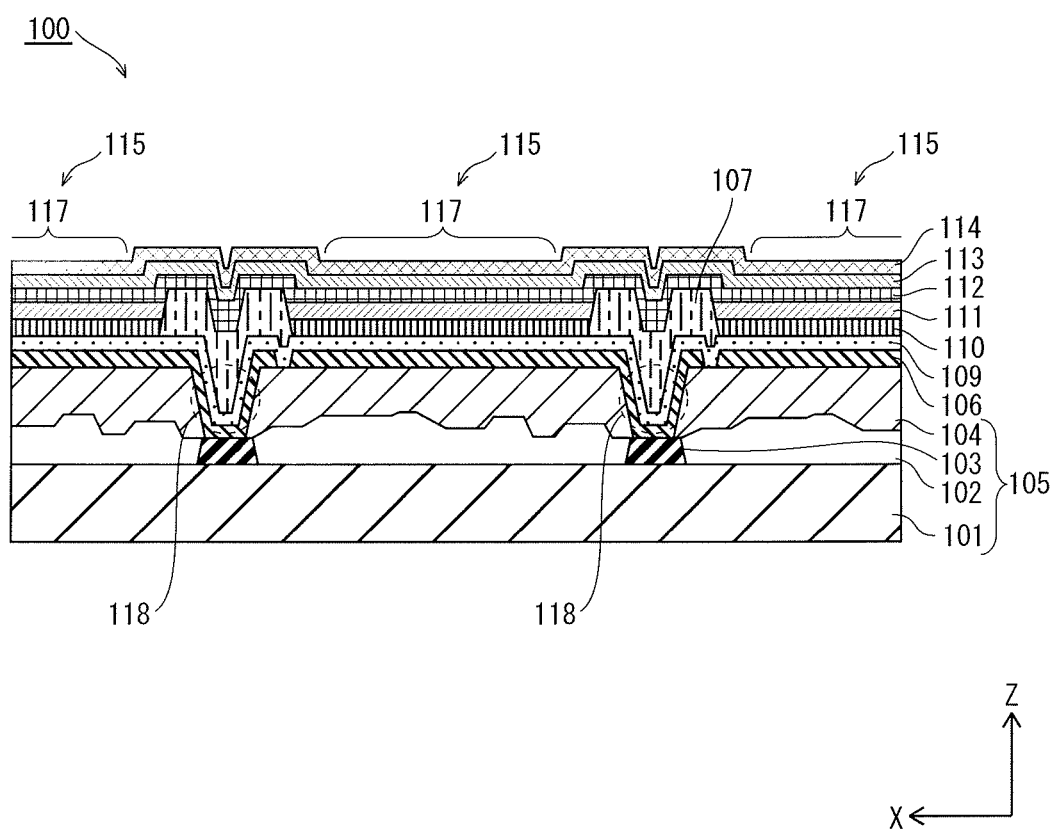
FIG. 11 is a partial cross-sectional view of an organic EL device 100 manufactured by a manufacturing method of an organic EL device relating to an embodiment of the present invention.

FIG. 11 is a partial cross-sectional view of an organic EL device 100 manufactured by the manufacturing method of an organic EL device relating to the present embodiment. Although the organic EL device 100 shown in FIG. 11 is illustrated as an organic EL display panel including a plurality of organic EL elements 115, this is just an example. Alternatively, the organic EL device 100 may include a single organic EL element.

The organic EL device 100 is of a so-called top emission type, and has a display surface on the upper side in the figure.

As shown in FIG. 11, a TFT (thin film transistor) layer 102, feed electrodes 103, and a planarizing film 104 are layered on a substrate body 101 in this order. A substrate 105 is constituted from the substrate body 101, the TFT layer 102, the feed electrodes 103, and the planarizing film 104. Pixel electrodes 106 and a hole injection layer 109 are layered on the substrate 105 in this order. A barrier rib layer 107 is formed on the hole injection layer 109. Each adjacent two portions of the barrier rib layer 107 have an aperture 117 therebetween, in which a light-emitting layer 111 is to be formed. A hole transport layer 110 and the light-emitting layer 111 are layered in the aperture 117 in this order. An electron transport layer 112, an electron injection layer 113, and a common electrode 114 are layered in this order on each of the light-emitting layers 111 and the barrier rib layer 107. In the present embodiment, the hole injection layer 109, the hole transport layers 110, the light-emitting layers 111, the electron transport layer 112, and the electron injection layer 113 are each equivalent to the functional layer of the present invention. Also, the pixel electrodes 106 and the common electrode 114 are equivalent to the first electrode and the second electrode of the present invention, respectively.

<Substrate>

The substrate body 101 is a back substrate of the organic EL device 100, and has a surface on which the TFT layer 102 including TFTs is formed to drive the organic EL device 100 by an active matrix method. The TFT layer 102 has the feed electrodes 103 formed thereon for feeding external electrical power to the TFTs.

The planarizing film 104 is provided for planarizing surface level difference caused by provision of the TFT layer 102 and the feed electrodes 103. The planarizing film 104 is made of organic material having excellent electrically-insulating properties.

The substrate 105, which is constituted from the substrate body 101, the TFT layer 102, the feed electrodes 103, and the planarizing film 104, is equivalent to the substrate of the present invention.

<Contact Holes 118>

Contact holes 118 are provided for electrically connecting the feed electrodes 103 with the pixel electrodes 106, and are through-holes in the planarizing film 104. The contact holes 118 are each formed so as to position between each adjacent two apertures 117 which are arranged in the Y-direction, and are covered with the barrier rib layer 107. If the contact holes 118 are not covered with the barrier rib layer 107, the light-emitting layers 111 are not planar due to the existence of the contact holes 118, and this causes unevenness in light emission and so on. In order to avoid such unevenness in light emission and so on, the contact holes 118 have the above configuration.

<Pixel Electrodes 106>

The pixel electrodes 106 are anodes, and are each formed for each light-emitting layer 111 which is formed in the aperture 117. Since the organic EL device 100 is of the top emission type, the pixel electrodes 106 are made of highly light-reflective material. The pixel electrodes 106 are equivalent to the first electrodes of the present invention.

<Hole Injection Layer 109>

The hole injection layer 109 is provided in order to promote injection of holes from the pixel electrodes 106 to the light-emitting layers 111.

<Barrier Rib Layer 107>

The barrier rib layer 107 has a function of, when the light-emitting layers 111 are formed, preventing mixing of inks (liquid materials), which contain materials of light-emitting layers and solvent, between red (R), green (G), and blue (B) colors.

The barrier rib layer 107 is provided so as to cover the above of the contact holes 118, and has trapezoidal cross-sections along an X-Z plane or a Y-Z plane.

Figure 12:
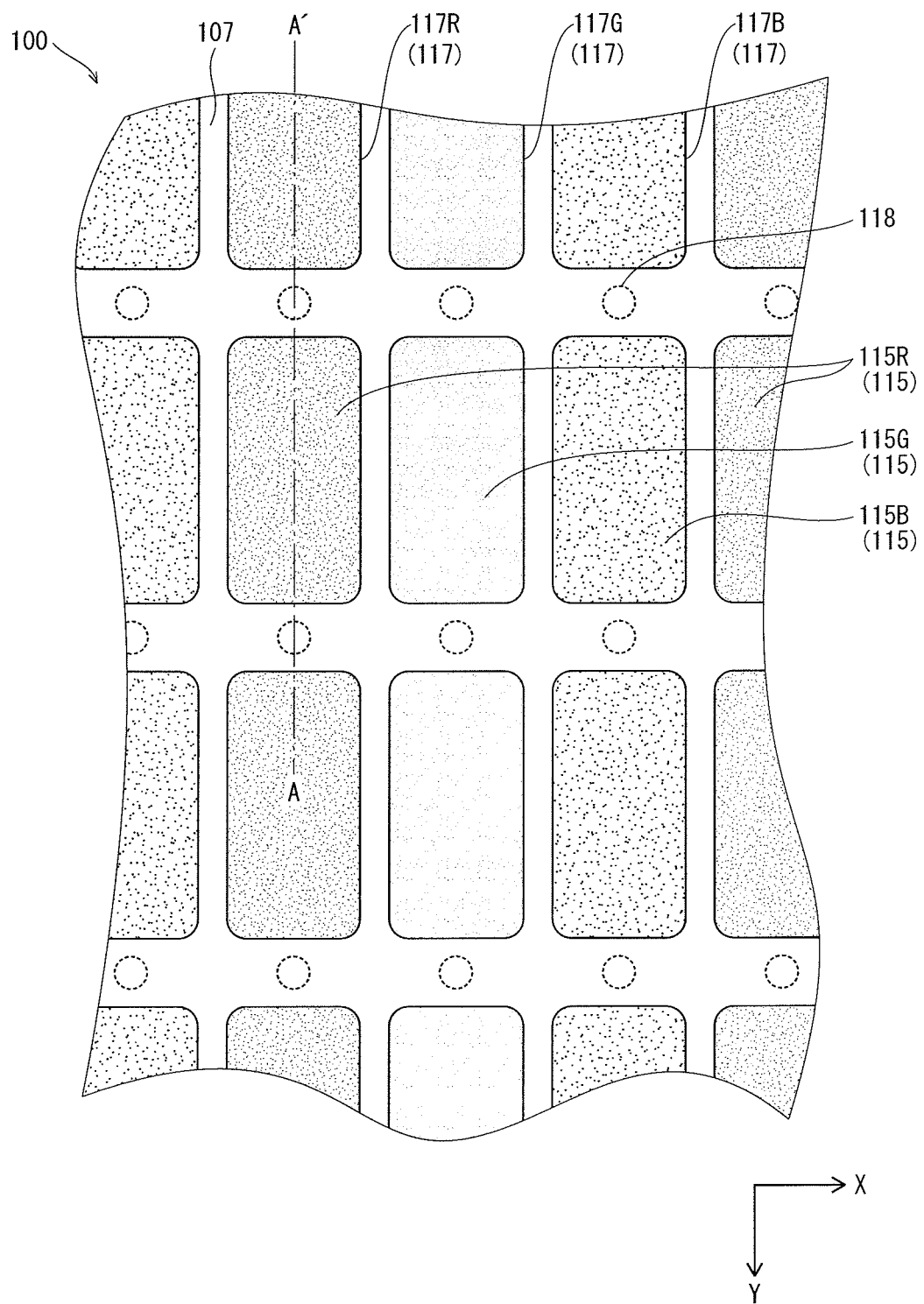
FIG. 12 schematically shows shape of a barrier rib layer of an organic EL display panel as the organic EL device 100 shown in FIG. 11.

FIG. 12 schematically shows the shape of the barrier rib layer 107 when the organic EL display panel as the organic EL device 100 is seen from the side of the display surface, where the hole transport layer 110, the light-emitting layers 111, the electron transport layer 112, the electron injection layer 113, and the common electrode 114 are omitted for convenience of the description. Note that the partial cross-sectional view in FIG. 11 is taken along a line A-A' in FIG. 12.

As shown in FIG. 12, the organic EL display panel 100 has the configuration in which a plurality of organic EL elements 115R of the R color, a plurality of organic EL elements 115G of the G color, and a plurality of organic EL elements 115B of the B color are arranged in the X-Y direction (in matrix). The organic EL elements 115R, 115G, and 115B are each a subpixel, and a combination of three subpixels of the organic EL elements 115R, 115G, and 115B corresponds to one pixel.

The apertures 117, which are formed in the barrier rib layer 107, are arranged in the X-Y direction each so as to correspond to one of the organic EL elements 115R, 115G, and 115B. The apertures 117 are each a region where the light-emitting layer 111 is to be formed. The arrangement and shape of the light-emitting layers 111 are defined in accordance with the arrangement and shape of the apertures 117. The apertures 117 are each a rectangle having a long side in the Y direction. Specifically, the apertures 117 for example each have a side of approximately 30 μm to 130 μm in the X direction (the column direction) and a side of approximately 150 μm to 600 μm in the Y direction (the row direction).

The apertures 117 are each specifically one of apertures 117R, 117G, and 117B that respectively correspond to the R, G, and B colors. The respective light-emitting layers 111 of the R, G, and B colors are respectively formed in the apertures 117R, 117G, and 117B. In other words, the apertures 117R, 117G, and 117B respectively correspond to the organic EL elements 115R, 115G, and 115B. Also, the apertures 117 are arranged in rows for each of the R, G, and B colors. The apertures 117 which belong to the same row are for the same color.

The contact holes 118 are each positioned between each adjacent two of the apertures 117 which are arranged in the Y direction, and in the lower part in the barrier rib layer 107. As described above, the pixel electrodes 106 are each formed for each of the light-emitting layers 111 formed in the apertures 117. This means that the pixel electrodes 106 are each provided for each subpixel.

<Hole Transport Layer 110>

Now back to the partial cross-sectional view in FIG. 11, the description continues. The hole transport layer 110 has a function of transporting holes injected by the pixel electrodes 106 to the light-emitting layers 111.

<Light-Emitting Layers 111>

The light-emitting layers 111 emit light through recombination of carriers, and each include light-emitting material corresponding to one of the R, G, and B colors. The respective light-emitting layers 111 including light-emitting materials of the R, G, and B colors are respectively formed in the apertures 117R, 117G, and 117B.

<Electron Transport Layer 112>

The electron transport layer 112 has a function of transporting electrons injected by the common electrode 114 to the light-emitting layers 111.

<Electron Injection Layer 113>

The electron injection layer 113 has a function of promoting injection of holes from the common electrode 114 to the light emitting layers 111.

<Common Electrode 114>

The common electrode 114 is a cathode, and is equivalent to the second electrode of the present invention. Since the organic EL display panel 100 is of the top emission type, the common electrode 114 is made of light-transmissive material.

<Others>

Although not shown in FIG. 11, a sealing layer is provided for suppressing deterioration of the light emitting layers 111 due to exposure to moisture, air, and so on. Since the organic EL display panel 100 is of the top emission type, the sealing layer is made of light-transmissive material such as SiN (silicon nitride) and SiON (silicon oxynitride).

Also, an ITO (indium tin oxide) layer or an IZO (indium zinc oxide) layer may be provided between each of the pixel electrodes 106 and the hole injection layer 109 for improving bondability therebetween. Furthermore, all the light-emitting layers 111 formed in the apertures 117 may be of the same color.

<Material of Layers>

The following shows examples of materials of the layers described above. It is of course possible to form the layers using materials other than materials shown below.

The substrate body 101: electrically-insulating material such as non-alkali glass, soda glass, nonfluorescent glass, phosphate glass, borate glass, quartz, acrylic resin, styrenic resin, polycarbonate resin, epoxy resin, polyethylene, polyester, silicone resin, and alumina The planarizing film 104: polyimide resin or acrylic resin The pixel electrodes 106: Ag (silver), Al (aluminum), alloy of silver, palladium, and copper, alloy of silver, rubidium, and gold, MoCr (alloy of molybdenum and chrome), or NiCr (alloy of nickel and chrome)

The barrier rib layer 107: acrylic resin, polyimide resin, or novolac-type phenolic resin The hole injection layer 109: metal oxide such as MoOx (molybdenum oxide), WOx (tungsten oxide), and MoxWyOz (molybdenum tungsten oxide), metal nitride, or metal oxynitride The hole transport layer 110: triazole derivative, oxadiazole derivative, imidazole derivative, polyarylalkane derivative, pyrazoline derivative and pyrazolone derivative, phenylenediamine derivative, arylamine derivative, amino-substituted chalcone derivative, oxazole derivative, styrylanthracene derivative, fluorenone derivative, hydrazone derivative, stilbene derivative, porphyrin compound, aromatic tertiary amine compound, styrylamine compound, butadiene compound, polystyrene derivative, hydrazone derivative, triphenylmethane derivative, or tetraphenylbenzene derivative (all disclosed in Japanese Patent Application Publication No. H5-163488)

The light-emitting layers 111: F8-F6 (copolymer of F8 (poly dioctylfluorene) and F6 (poly dihexylfluorene)), or fluorescent material disclosed in Japanese Patent Application Publication No. H5-163488 such as oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of 8-hydroxyquinoline compound, metal complex of 2-bipyridine compound, complex of Schiff base and group three metal, metal complex of oxine, and rare earth metal complex The electron transport layer 112: barium, phthalocyanine, or lithium fluoride The electron injection layer 113: nitro-substituted fluorenone derivative, thiopyran dioxide derivative, diphenylquinone derivative, perylene tetracarboxyl derivative, anthraquinodimethane derivative, fluoronylidene methane derivative, anthrone derivative, oxadiazole derivative, perinone derivative, or quinoline complex derivative (all disclosed in Japanese Patent Application Publication No. H5-163488)

The common electrode 114: ITO or IZO

<Manufacturing Method of Organic EL Device 100>

First, description is given on an example of the overall manufacturing method of an organic EL display panel as the organic EL device 100. Then, detailed description is given on an application step included in a functional layer forming step of the manufacturing method.

<Outline>

Figure 13A:
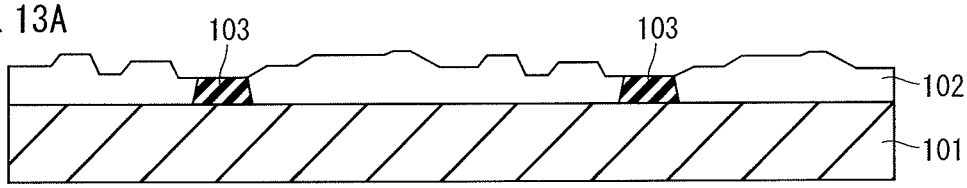
FIG. 13A to FIG. 13E are cross-sectional views schematically showing part of a manufacturing step of a manufacturing method of the organic EL device 100.

A substrate 101 is prepared on which a TFT layer 102 and feed electrodes 103 are formed (FIG. 13A).

Figure 13B:
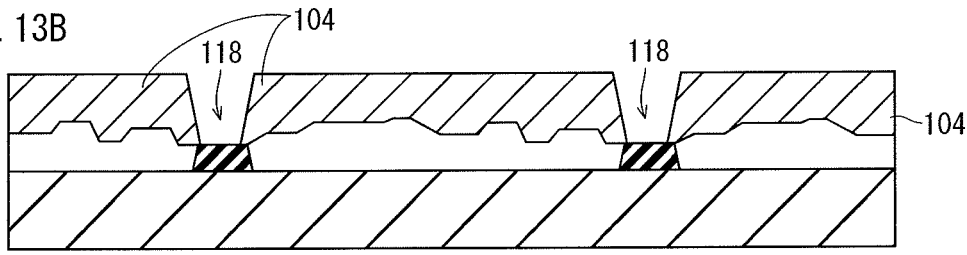

A planarizing film 104 having thickness of approximately 4 μm is formed on the TFT layer 102 and the feed electrodes 103 using organic material having excellent electrically-insulating properties by a photoresist method. At this stage, contact holes 118 are each formed in accordance with the position between each two apertures 117 which are adjacent to each other in the Y direction (FIG. 13B). By using the photoresist method in combination with a desirable pattern mask, the planarizing film 104 and the contact holes 118 can be formed simultaneously. The contact holes 118 are of course not limited to being formed by this method. Alternatively, the contact holes 118 may be for example formed by, after uniformly forming the planarizing film 104, removing portions of the planarizing film 104 at predetermined positions. This completes a step of forming the substrate 105.

Then, a pixel electrode 106 is formed on the substrate 105 for each subpixel by a vacuum deposition method or a sputtering method, so as to be electrically connected to a corresponding one of the feed electrodes 103. The pixel electrode 106 has thickness of approximately 150 nm and is made of metal material. This step of forming the pixel electrodes 106 on the substrate 105 is equivalent to the forming the first electrode of the present invention.

Figure 13C:
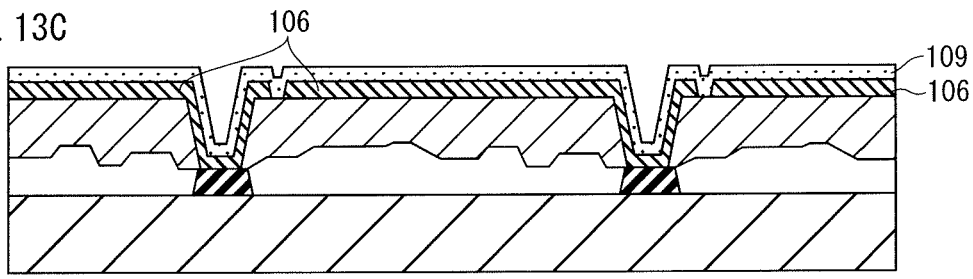

Next, a hole injection layer 109 is formed by a reactive sputtering method (FIG. 13C).

Figure 13D:
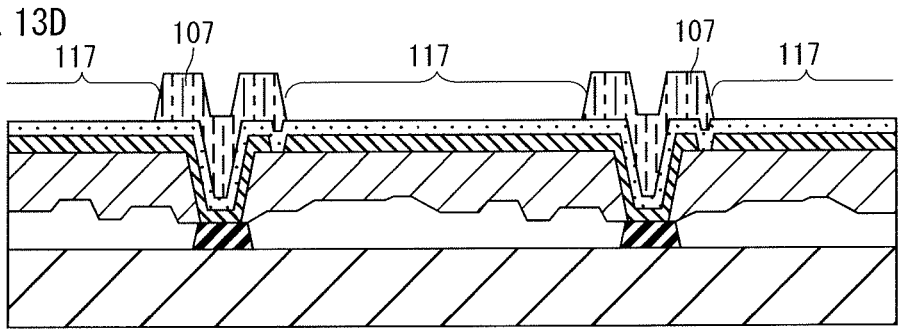

Next, a barrier rib layer 107 is formed by a photolithography method. Firstly, material including photosensitive resist in paste form is prepared as material of barrier rib layer. The material of barrier rib layer is uniformly applied on the hole injection layer 109. A mask shaped into a pattern of the apertures 117 shown in FIG. 12 is overlaid on the applied material of barrier rib layer. Next, the material of barrier rib layer on which the mask is overlaid is exposed to light. As a result, a pattern of barrier rib layer is formed. Subsequently, excess part of the material of barrier rib layer is washed off with an aqueous or non-aqueous etchant (developer). This completes patterning of the material of barrier rib layer. In this way, the apertures 117 in which light-emitting layers 111 are to be formed are defined, and the barrier rib layer 107 having repellency at least on a surface thereof is complete (FIG. 13D).

Note that during a step of forming the barrier rib layer 107, the surface of the barrier rib layer 107 may be treated with predetermined alkaline solution, water, or organic solvent, or by plasma treatment, in order to adjust the angle of contact between the barrier rib layer 107 and ink for hole transport layer and between the barrier rib layer 107 and ink for organic light-emitting layers to be applied to the apertures 117 in a subsequent step, or to provide the surface of the barrier rib layer 107 with repellency.

Figure 13E:
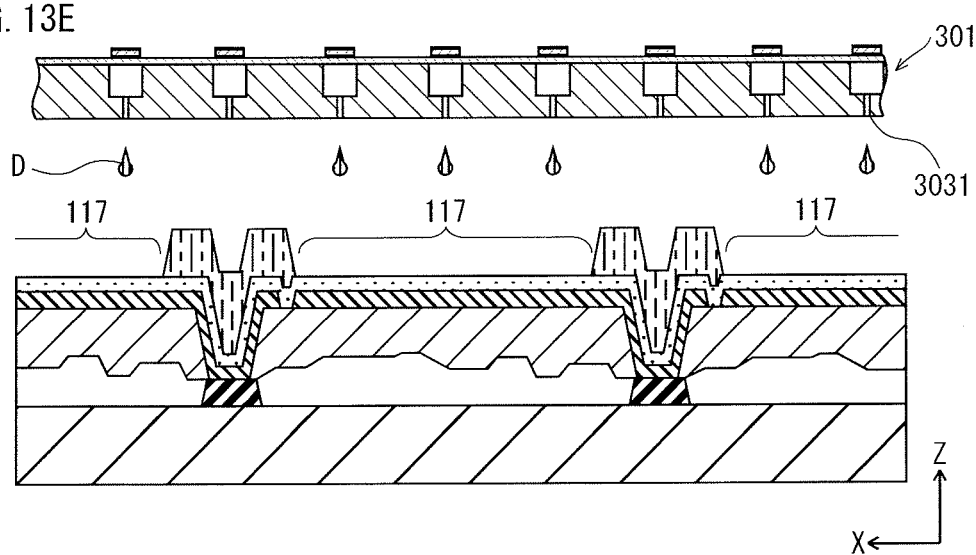
Figure 14A:
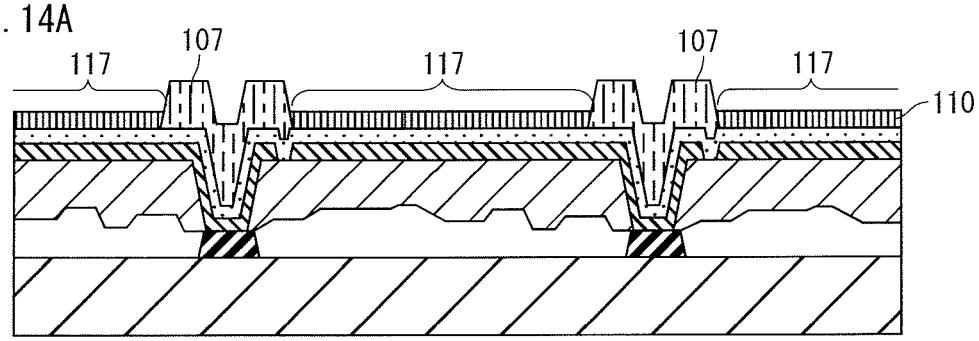
FIG. 14A to FIG. 14D are cross-sectional views schematically showing part of the manufacturing step of the manufacturing method of the organic EL device 100.

Next, the ink for hole transport layer is prepared by mixing material of a hole transport layer 110 and solvent at a predetermined ratio. The ink for hole transport layer is supplied to the ink jet heads 301, and droplets D as the ink for hole transport layer are ejected through the nozzles 3031 (see FIG. 3) corresponding to the apertures 117 in the application step (FIG. 13E). Then, the solvent contained in the ink is evaporated and dried, and is further heated and baked as necessary. As a result, the hole transport layer 110 is formed (FIG. 14A).

Figure 14B:
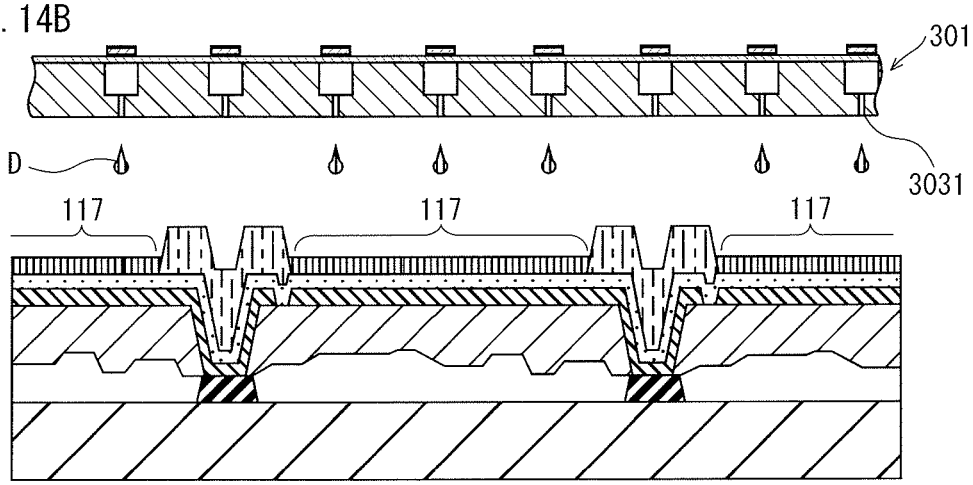
Figure 14C:
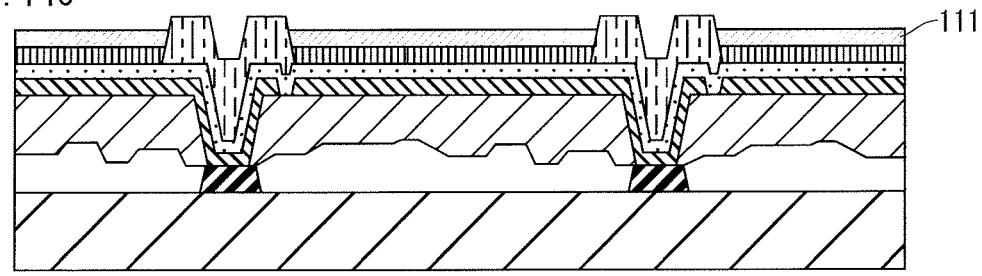

Next, the ink for organic light-emitting layers is prepared by mixing organic material of the light-emitting layers 111 and solvent at a predetermined ratio. The ink for organic light-emitting layers is supplied to the ink jet heads 301, and droplets D as the ink for organic light-emitting layers are ejected through the nozzles 3031 corresponding to the apertures 117 in the application step (FIG. 14B). Then, the solvent contained in the ink is evaporated and dried, and is further heated and baked as necessary. As a result, the light-emitting layers 111 are formed (FIG. 14C).

Next, material of an electron transport layer 112 is formed on surfaces of the light-emitting layers 111 by the vacuum deposition method. As a result, the electron transport layer 112 is formed. Subsequently, material of an electron injection layer 113 is formed by a vapor deposition method, a spin-coat method, a cast method, or the like. As a result, the electron injection layer 113 is formed. Steps of forming the hole injection layer 109, the hole transport layer 110, the light-emitting layers 111, the electron transport layer 112, and the electron injection layer 113, which have been described above, are equivalent to the forming the functional layers of the present invention.

Figure 14D:
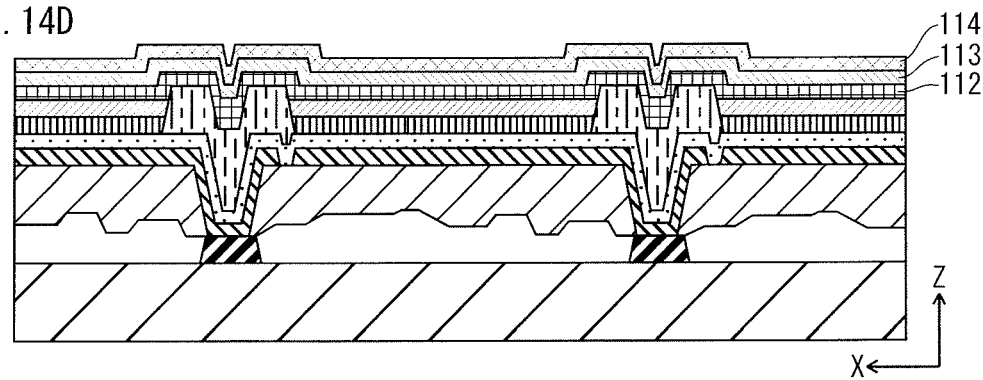

Next, material of a common electrode 114 is formed on a surface of the electron injection layer 113 by the vacuum deposition method, the sputtering method, or the like. As a result, the common electrode 114 is formed (FIG. 14D). A step of forming the common electrode 114 is equivalent to the forming the second electrode of the present invention.

Although not shown in the figure, a sealing layer is formed on a surface of the common electrode 114 using light-transmissive material such as SiN and SiON by the sputtering method, a CVD method, or the like.

The organic EL device 100 is complete through the above steps.

<Application Step>

As described above, the hole transport layer 110 and the light-emitting layers 111 are each formed by preparing ink containing material of layer and solvent and applying the ink, and evaporating and drying the solvent, and further heating and baking the solvent as necessary. The following describes in detail the application step for particularly forming the light-emitting layers 111.

(Ink Jet Device 1000)

The application step is performed using the ink jet device 1000 relating to the present invention described in Embodiment 1. The ink jet device 1000 has the configuration as described above with reference to FIG. 1 to FIG. 3. The application step is performed by the ink jet method using the ink jet device 1000 shown in FIG. 1. In the present embodiment, the ink jet device 1000 includes a plurality of head units 30 which are not illustrated, and the head units 30 each correspond to a different type of ink and each include a plurality of ink jet heads 301. Here, description is give on the case where the elongated apertures 117 are arranged so as to have long sides intersecting with the scanning direction (the column (Y) direction) of the head units 30 (the ink jet heads 301) at a predetermined angle.

(Positional Relationship Between Head Units 30 and Apertures of Application Target Substrate)

Figure 15:
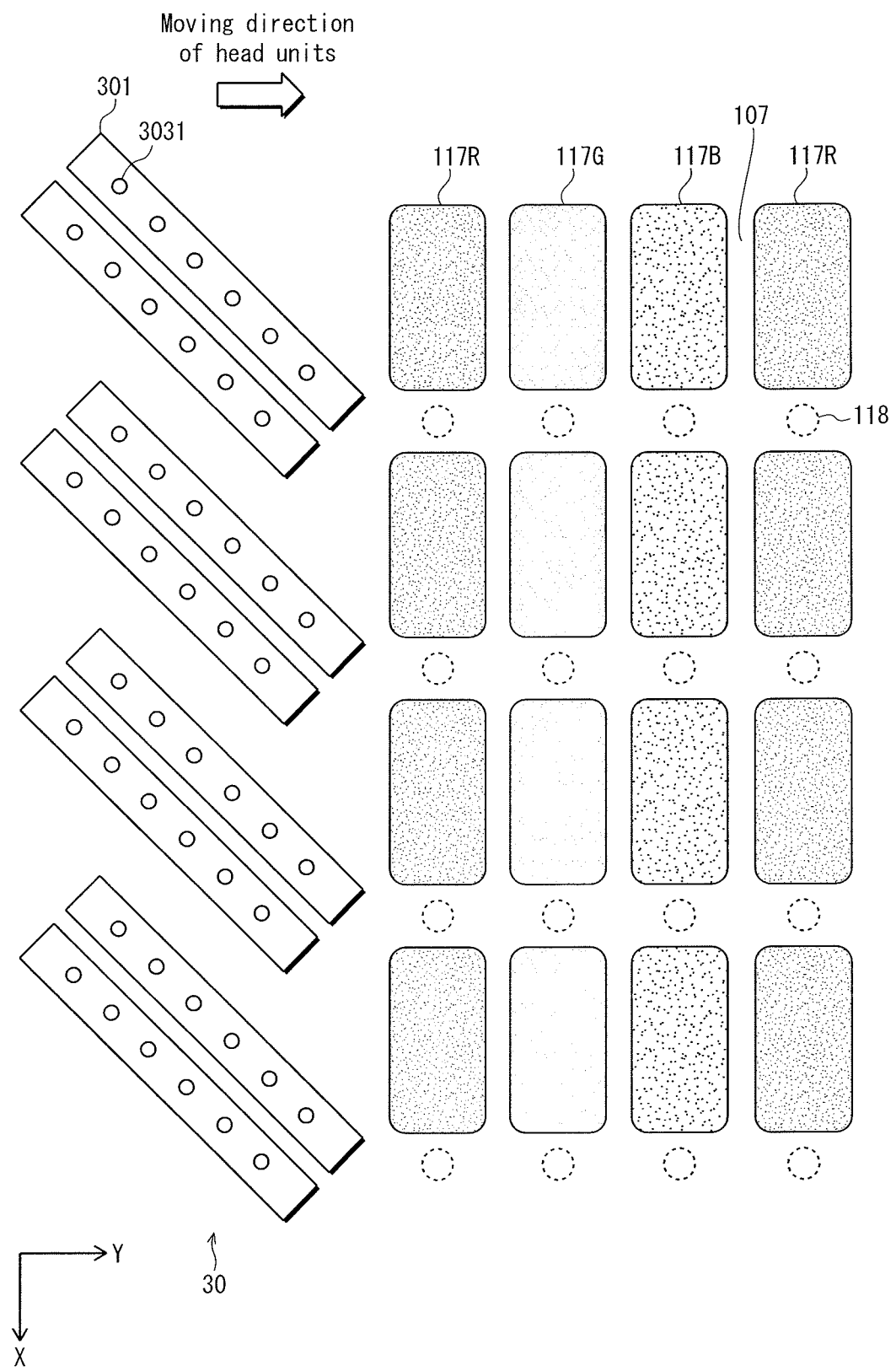
FIG. 15 shows positional relationship between an application target substrate and an ink head units 301 in an application step of the manufacturing method of the organic EL device 100.

FIG. 15 shows the positional relationship between the head units 30 and an application target substrate in the manufacturing step of the organic EL display panel.

In FIG. 15, the application target substrate is placed on the right side of the head units 30. The application target substrate is in the state of not yet undergoing the application step. In other words, the application target substrate is in the state of having provided therein the barrier rib layer 107 in which the apertures 117 are formed in units of pixels in matrix. The ink jet heads 301 each include a plurality of nozzles 3031 through which ink droplets are ejected. The nozzles 3031 are arranged in the row (X) direction at a predetermined pitch. Here, an application pitch in relation to the nozzles 3031 is adjusted by changing the angle of the ink jet heads 301 relative to the row (X) direction.

In the present embodiment as shown in FIG. 15, the ink jet heads 301 each include the six nozzles 3031 which are arranged in row in the longitudinal direction. Five ones of the six nozzles 3031 correspond to one of the apertures 117 (one of the apertures 117R, 117G, and 117B). The head units 30 of the ink jet device 1000 shown in FIG. 15 each correspond to one type of the apertures 117 (one of the apertures 117R, 117G, and 117B). Although not shown in the figure, the head units 30 with the same configuration correspond to the remaining two types of the apertures 117. In other words, the head units 30 each include the plurality of ink jet heads 301 each housing therein ink corresponding to one of the luminescent colors (the R, G, and B colors) of the light-emitting layers.

In the application step, defined ink droplets are ejected through the nozzles 3031, which correspond to the apertures 117, to the apertures 117 by causing the inkjet heads 301 to scan in the column (Y) direction. The light-emitting layers 111 are formed through the above step of forming the light-emitting layers 111. At this stage, the total amount of the ejected droplets needs to be uniform between the adjacent apertures 117.

The hole transport layer 110 is formed in the application step similar to that of the light-emitting layers 111. However, a single type of ink is used in the application step of the hole transport layer 110, differently from that of the light-emitting layer 111. Accordingly, in the application of the hole transport layer 110 as shown in FIG. 15, ink droplets are ejected by causing only the inkjet heads 301 to scan, which are included in one of the head units 30 and house therein the single type of ink.

(Drive Voltage)

The materials of the light-emitting layers 111 each correspond to one of the luminescent colors (the R, G, and B colors). Accordingly, in the application step for forming the light-emitting layers 111, application is performed by causing the ink jet heads 301 housing therein inks corresponding to the luminescent colors to scan.

Here, in the case where an ink droplet having a smaller volume than the defined volume is ejected through a specified one of the nozzles 3031 of the ink jet head 301 due to the manufacturing irregularities of the members constituting the ink housing unit 301e or the members constituting the pressure application unit 3010, drive voltage having the waveform configuration including the preliminary vibration waveform part and the main vibration waveform part (for example, FIG. 8A) is applied to the pressure application unit 3010 corresponding to the specified nozzle. With respect to a remainder of the nozzles 3031, drive voltage having the waveform configuration not including the preliminary vibration waveform part (for example, FIG. 4A) is applied without performance of the preliminary drive operation.

Also, the physical properties of the ink of course differ for each corresponding luminescent color. Accordingly, when a droplet of ink corresponding to the luminescent color R having a smaller volume than the defined volume is ejected for example, drive voltage having the waveform configuration including the preliminary vibration waveform part and the main vibration waveform part (for example, FIG. 8A) is applied to the piezoelectric element of the ink jet head 301 in which the ink corresponding to the luminescent color R is housed. With respect to the ink jet heads 301 in which inks corresponding to the other luminescent colors are housed, drive voltage having the waveform configuration not including the preliminary vibration waveform part (for example, FIG. 4A) is applied without performance of the preliminary drive operation.

When control needs to be performed on the ejection behavior of the ink housed in the ink jet head 301 for increasing the volume of the ink droplet for example, drive voltage having the waveform configuration including the preliminary vibration waveform part is applied. As a result, it is possible to control the volume of the ink droplet to be ejected between the nozzles or between the ink jet heads, without varying the drive voltage so much, or without varying so much the parameters correlated with the magnitude of the drive voltage such as the flight speed of the ink relating to the landing accuracy.

The hole transport layer 110 is formed in the application step similarly to the light-emitting layers 111. Specifically, drive voltage having the waveform configuration including the preliminary vibration waveform part and the main vibration waveform part is applied, in response to the manufacturing irregularities of the members constituting the ink housing unit or the members constituting the pressure application unit, or in response to the physical properties of the used ink.

In the application step of the light-emitting layers 111 and the hole transport layer 110 such as above, drive voltage having the waveform configuration including the preliminary vibration waveform part and the main vibration waveform part (for example, FIG. 8A) is applied to the piezoelectric element corresponding to at least one of the nozzles included in the ink jet head, in response to the manufacturing irregularities of the members constituting the ink housing unit or the members constituting the pressure application unit, or in response to the physical properties of the ink housed in the ink housing unit. Light-emitting layers of an organic EL device have thickness of some ten nm order. Accordingly, inequality in volume of an ink droplet to be ejected tends to cause ununiform film thickness of the light-emitting layers. This further causes ununiform luminance, and as a result the manufacturing yield extremely decreases. The same applies to the hole transport layer. Accordingly, it is possible to improve the manufacturing yield of the organic EL device by performing the application process with use of the ink jet device relating to the present invention, as described in the present embodiment.

In the present embodiment, in forming the hole transport layer and the light-emitting layers corresponding to the luminescent colors, the waveform configuration of drive voltage does not vary for an ink jet head during a time period from start to completion of application. However, the application step is not limited to this. Alternatively, drive voltage having the waveform configuration including the main vibration waveform part and not including the preliminary vibration waveform part may be applied first, and then drive voltage having the waveform configuration including the preliminary vibration waveform part and the main vibration waveform part (for example, FIG. 8A) may be applied for a predetermined time period since the start of the application. The above application step can be used, for example, in a case where volume of ink droplet to be ejected reduces at a time after elapse of a predetermined time period since the start of application.

<Others>

The specific description has been provided on the ink jet device and the manufacturing method of the organic EL device relating to the above embodiments of the present invention. It should be noted, however, that the above embodiments are merely examples used to describe the effects of the structure of the present invention. Therefore, the present invention should not be construed as being limited to the above embodiments.

The ink jet device may include only one ink jet head, and alternatively may include a plurality of ink jet heads. In the case where the ink jet device includes a plurality of ink jet heads, the following configuration may be employed for example: the head unit 30 shown in FIG. 1 is provided in plural, each of the gantry unit 210 and the movable member 220 are provided for each of the head units 30, and the ink jet head units 30 are each connected to the control device 15. Also, the ink jet head units 30 each may include a plurality of nozzles. Alternatively, for example as shown in the region F in FIG. 3B, the ink jet head may include only one nozzle corresponding to one piezoelectric element.

With respect to one or more of the ink jet heads or one or more of the nozzles included in the one or more ink jet heads, drive voltage may be applied, which has the waveform configuration including the preliminary vibration waveform part and the main vibration waveform. With respect to a remainder of the ink jet heads or the nozzles, drive voltage may be applied, which has the waveform configuration including the main vibration waveform without performance of the preliminary drive operation, or alternatively the preliminary drive operation may be performed.

In the above embodiments, the flexural vibrator employing the piezoelectric system is used as the pressure application unit. Alternatively, the pressure application unit may be for example a longitudinal vibrator. Further alternatively, the pressure application unit may be constituted from a plurality of piezoelectric elements stacked on a vibration plate, instead of only a piezoelectric element.

In the above embodiments as shown in FIG. 5A, the drive waveform of the drive voltage includes the preliminary vibration waveform part and the main vibration waveform part, each of which correspond to the pull ejection method, and the vibration suppression waveform part. Alternatively, the drive waveform of the drive voltage may include the main vibration waveform part corresponding to the push ejection method (FIG. 6A), or may include the preliminary vibration waveform part corresponding to the push ejection method (FIG. 6C). Further alternatively, the drive waveform of the drive voltage may not include the vibration suppression waveform part (FIG. 6B).

In the above embodiments, the device configuration of the organic EL device has been described as being of the top emission type. Accordingly, the cathode has been described as being made of light-transmissive conductive material such as ITO and IZO. However, the device configuration of the organic EL device relating to the present invention is not limited to these. Alternatively, the organic EL device may be of the bottom emission type, and the cathode may be made of metal material such as aluminum. Also, each functional layer is not limited to be constituted from any one of the hole injection layer, the hole transport layer, the light-emitting layers, the electron transport layer, and the electron injection layer. Alternatively, the functional layer only needs to include at least the light-emitting layers that are formed through application.

In the above embodiments, the organic EL device that is to be manufactured by the manufacturing method of the organic EL device has been described as an organic EL display panel. However, the organic EL device targeted by the present invention is not limited to this, and alternatively may be an organic EL device including a single organic EL element.

INDUSTRIAL APPLICABILITY

The ink jet device relating to the present invention can perform wide-range control on droplet volume, and is utilizable in an application step of an organic film of an organic imaging element, an organic EL element, and the like, and is utilizable preferably in an application step of a device with a large-size substrate such as an organic EL display panel.

REFERENCE SIGNS LIST 15 control device
30 head unit
40 ink
100 organic EL device
101 substrate body
102 TFT layer
103 feed electrode
105 substrate
106 pixel electrode
109 hole injection layer
110 hole transport layer
111 light-emitting layer
112 electron transport layer
113 electron injection layer
114 common electrode
115 organic EL element
213 control unit
300 ejection control unit
301 ink jet head
301e ink housing unit
301h vibration plate
1000 ink jet device
3010 pressure application unit
3031 nozzle

The invention claimed is:

1. An ink jet device comprising:
an ink jet head including an ink housing that houses therein ink, a pressure applicator that applies pressure to the ink by applying voltage to a piezoelectric element according to a voltage waveform, and a nozzle through which a droplet of the ink is ejected; and
an ejection controller that controls an ejection amount of the droplet of the ink by varying an application voltage to be applied to the piezoelectric element, wherein
the voltage waveform of the application voltage includes a preliminary vibration waveform part and a main vibration waveform part,
the preliminary vibration waveform part is for performing a preliminary drive operation of pushing the ink toward an outer edge of the nozzle to the extent that the droplet of the ink is not ejected through the nozzle,
the main vibration waveform part is for performing a main drive operation of ejecting the droplet of the ink through the nozzle after performance of the preliminary drive operation,
the ejection controller performs the preliminary drive operation and the main drive operation according to the preliminary vibration waveform part and the main vibration waveform part, respectively, and
a ratio of a displacement amount X of the application voltage applied for performing the preliminary drive operation to a displacement amount Y of the application voltage applied for performing the main drive operation is set so that the relation $20\% \leq X/Y \leq 40\%$ is satisfied, and
the preliminary vibration waveform part and the main vibration waveform part are independent of each other and a constant application voltage waveform part is provided between the preliminary vibration waveform part and the main vibration waveform part.

2. The ink jet device of claim 1, wherein
the ink housing, the pressure applicator, and the nozzle are each included in plural in the ink jet head,
with respect to one or more of the nozzles, the ejection controller performs the preliminary drive operation and the main drive operation, and
with respect to a remainder of the nozzles, the ejection controller does not perform the preliminary drive operation.

3. The ink jet device of claim 1, wherein
the preliminary drive operation is set so that a flight speed V of a droplet of the ink to be ejected in the main drive operation satisfies $4 \text{ m/s} \leq V \leq 10 \text{ m/s}$.

4. The ink jet device of claim 1, wherein
the voltage waveform of the application voltage further includes a vibration suppression waveform part for performing a vibration suppression operation that suppresses vibration occurring on a surface of the ink due to the main drive operation, and
with respect to the nozzle with respect to which the preliminary drive operation is performed, the ejection controller performs the vibration suppression operation according to the vibration suppression waveform part.

5. The ink jet device of claim 4, wherein
the surface of the ink at a start time of the main drive operation after performance of the preliminary drive operation is positioned more downward than the surface of the ink at a start time of the main drive operation without performance of the preliminary drive operation.

6. A method of manufacturing an organic EL device comprising:
forming a first electrode on a substrate;
forming one or more functional layers including a light-emitting layer on the first electrode;
forming a second electrode on the functional layers, wherein
in the forming of the one or more functional layers, the one or more functional layers, including at least the light-emitting layer, are formed by applying ink including material of the functional layer and solvent with use of the ink jet device of claim 1, and at least evaporating and drying the solvent.

7. An ink jet device comprising:
an ink jet head including an ink housing that houses therein ink, a pressure applicator that applies pressure to the ink by applying voltage to a piezoelectric element according to a voltage waveform, and a nozzle through which a droplet of the ink is ejected; and an ejection controller that controls an ejection amount of the droplet of the ink by varying an application voltage to be applied to the piezoelectric element, wherein the voltage waveform of the application voltage includes a preliminary vibration waveform part and a main vibration waveform part, the preliminary vibration waveform part is for performing a preliminary drive operation of pushing the ink toward an outer edge of the nozzle to the extent that the droplet of the ink is not ejected through the nozzle, the main vibration waveform part is for performing a main drive operation of ejecting the droplet of the ink through the nozzle after performance of the preliminary drive operation, the ejection controller performs the preliminary drive operation and the main drive operation according to the preliminary vibration waveform part and the main vibration waveform part, respectively, and a ratio of a displacement amount X of the application voltage applied for performing the preliminary drive operation to a displacement amount Y of the application voltage applied for performing the main drive operation is set so that the relation $20\% \leq X/Y \leq 40\%$ is satisfied, and the preliminary vibration waveform part and the main vibration waveform part are not inclined with respect to time.

8. An ink jet device comprising:

an ink jet head including an ink housing that houses therein ink, a pressure applicator that applies pressure to the ink by applying voltage to a piezoelectric element according to a voltage waveform, and a nozzle through which a droplet of the ink is ejected; and an ejection controller that controls an ejection amount of the droplet of the ink by varying an application voltage to be applied to the piezoelectric element, wherein the voltage waveform of the application voltage includes a preliminary vibration waveform part and a main vibration waveform part, the preliminary vibration waveform part is for performing a preliminary drive operation of pushing the ink toward an outer edge of the nozzle to the extent that the droplet of the ink is not ejected through the nozzle, the main vibration waveform part is for performing a main drive operation of ejecting the droplet of the ink through the nozzle after performance of the preliminary drive operation, the ejection controller performs the preliminary drive operation and the main drive operation according to the preliminary vibration waveform part and the main vibration waveform part, respectively, and a ratio of a displacement amount X of the application voltage applied for performing the preliminary drive operation to a displacement amount Y of the application voltage applied for performing the main drive operation is set so that the relation $20\% \leq X/Y \leq 40\%$ is satisfied, and the preliminary vibration waveform part and the main vibration waveform part provide respective movements of the ink in a same direction.

9. An ink jet device comprising:

an ink jet head including an ink housing that houses therein ink, a pressure applicator that applies pressure to the ink by applying voltage to a piezoelectric element according to a voltage waveform, and a nozzle through which a droplet of the ink is ejected; and an ejection controller that controls an ejection amount of the droplet of the ink by varying an application voltage to be applied to the piezoelectric element, wherein the voltage waveform of the application voltage includes a preliminary vibration waveform part and a main vibration waveform part, the preliminary vibration waveform part is for performing a preliminary drive operation of pushing the ink toward an outer edge of the nozzle to the extent that the droplet of the ink is not ejected through the nozzle, the main vibration waveform part is for performing a main drive operation of ejecting the droplet of the ink through the nozzle after performance of the preliminary drive operation, the ejection controller performs the preliminary drive operation and the main drive operation according to the preliminary vibration waveform part and the main vibration waveform part, respectively, and a ratio of a displacement amount X of the application voltage applied for performing the preliminary drive operation to a displacement amount Y of the application voltage applied for performing the main drive operation is set so that the relation $20\% \leq X/Y \leq 40\%$ is satisfied, and the preliminary vibration waveform part is for expanding and shrinking the ink housing.

* * * * *